(12) United States Patent
Leong et al.

(10) Patent No.: US 11,716,026 B2
(45) Date of Patent: *Aug. 1, 2023

(54) STACKED POWER SUPPLY TOPOLOGIES AND INDUCTOR DEVICES

(71) Applicant: Infineon Technologies Austria AG, Villach (AT)

(72) Inventors: Kennith K. Leong, Villach (AT); Matthias J. Kasper, Villach (AT); Luca Peluso, Villach (AT); Gerald Deboy, Klagenfurt (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 17/307,486

(22) Filed: May 4, 2021

(65) Prior Publication Data

US 2021/0257924 A1    Aug. 19, 2021

Related U.S. Application Data

(63) Continuation of application No. 16/655,432, filed on Oct. 17, 2019, now Pat. No. 11,050,355.

(51) Int. Cl.
*H05K 3/32* (2006.01)
*H02M 3/158* (2006.01)
(Continued)

(52) U.S. Cl.
CPC .......... *H02M 3/1584* (2013.01); *H01F 27/24* (2013.01); *H01F 27/28* (2013.01);
(Continued)

(58) Field of Classification Search
CPC ........ H02M 7/003; H01F 41/04; H01F 27/28; H01F 41/0206; H01F 27/24; H05K 3/32;
(Continued)

(56) References Cited

U.S. PATENT DOCUMENTS 6,362,986 B1   3/2002   Schuitz et al.
7,548,046 B1   6/2009   Stratakos et al.
(Continued)

OTHER PUBLICATIONS

EP Search Report, EP 20 20 2067, dated May 11, 2021, pp. 1-15.
European Search Report, EP 20202067.3, dated Feb. 24, 2021, pp. 15.

*Primary Examiner* — Sherman Ng
(74) *Attorney, Agent, or Firm* — Armis IP Law, LLC

(57) ABSTRACT

According to one configuration, an inductor device comprises: core material and one or more electrically conductive paths. The core material is magnetically permeable and surrounds (envelops) the one or more electrically conductive paths. Each of the electrically conductive paths extends through the core material of the inductor device from a first end of the inductor device to a second end of the inductor device. The magnetically permeable core material is operative to confine (guide, carry, convey, localize, etc.) respective magnetic flux generated from current flowing through a respective electrically conductive path. The core material stores the magnetic flux energy (i.e., first magnetic flux) generated from the current flowing through the first electrically conductive path. One configuration herein includes a power converter assembly comprising a stack of components including the inductor device as previously described as well as a first power interface, a second power interface, and one or more switches.

48 Claims, 23 Drawing Sheets

(51) Int. Cl.
| | |
|---|---|
| *H01F 27/24* | (2006.01) |
| *H01F 27/28* | (2006.01) |
| *H01F 41/02* | (2006.01) |
| *H01F 41/04* | (2006.01) |
| *H02M 7/00* | (2006.01) |
| *H05K 1/18* | (2006.01) |
| *H02M 3/335* | (2006.01) |
| *H02M 3/00* | (2006.01) |

(52) U.S. Cl.
CPC ......... *H01F 41/0206* (2013.01); *H01F 41/04* (2013.01); *H02M 3/33573* (2021.05); *H02M 7/003* (2013.01); *H05K 1/181* (2013.01); *H05K 3/32* (2013.01); *H02M 3/003* (2021.05); *H05K 2201/1003* (2013.01); *H05K 2201/10015* (2013.01); *H05K 2201/10053* (2013.01); *H05K 2201/10189* (2013.01)

(58) Field of Classification Search
CPC ........... H05K 1/181; H05K 2201/1003; H05K 2201/10189; H05K 2201/10053; H05K 2201/10015
USPC .................................................. 361/781, 782
See application file for complete search history.

(56) References Cited

U.S. PATENT DOCUMENTS

| | | |
|---|---|---|
| 10,128,035 B2 | 11/2018 | Yao et al. |
| 2011/0102122 A1 | 5/2011 | Mano et al. |
| 2015/0162297 A1* | 6/2015 | Cho ........................ H01L 24/49 257/76 |
| 2016/0104665 A1* | 4/2016 | Cho ..................... H02M 7/003 438/123 |
| 2017/0345551 A1 | 11/2017 | Yoshioka et al. |
| 2018/0053722 A1* | 2/2018 | Cho ..................... H01L 23/5389 |
| 2019/0081562 A1 | 3/2019 | Palm et al. |

* cited by examiner

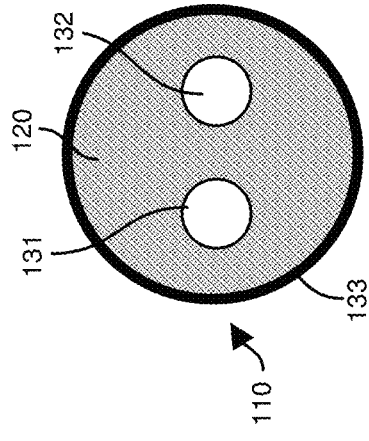
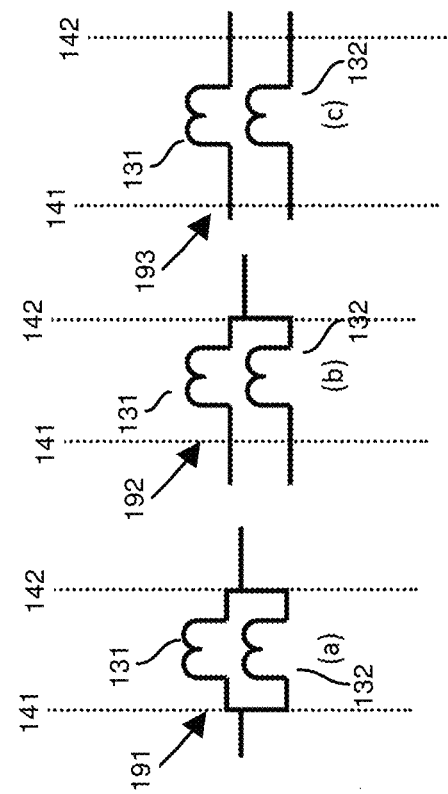
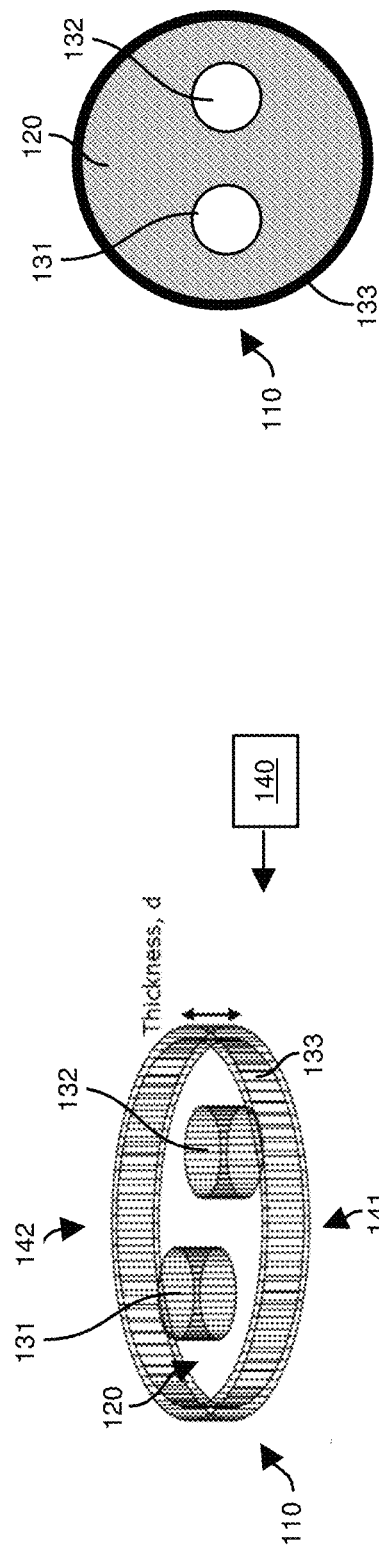
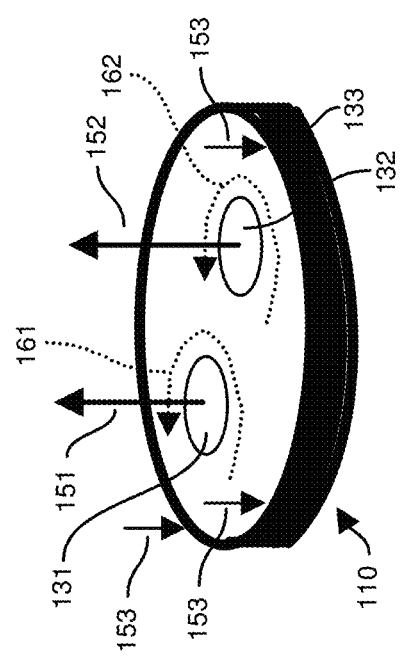

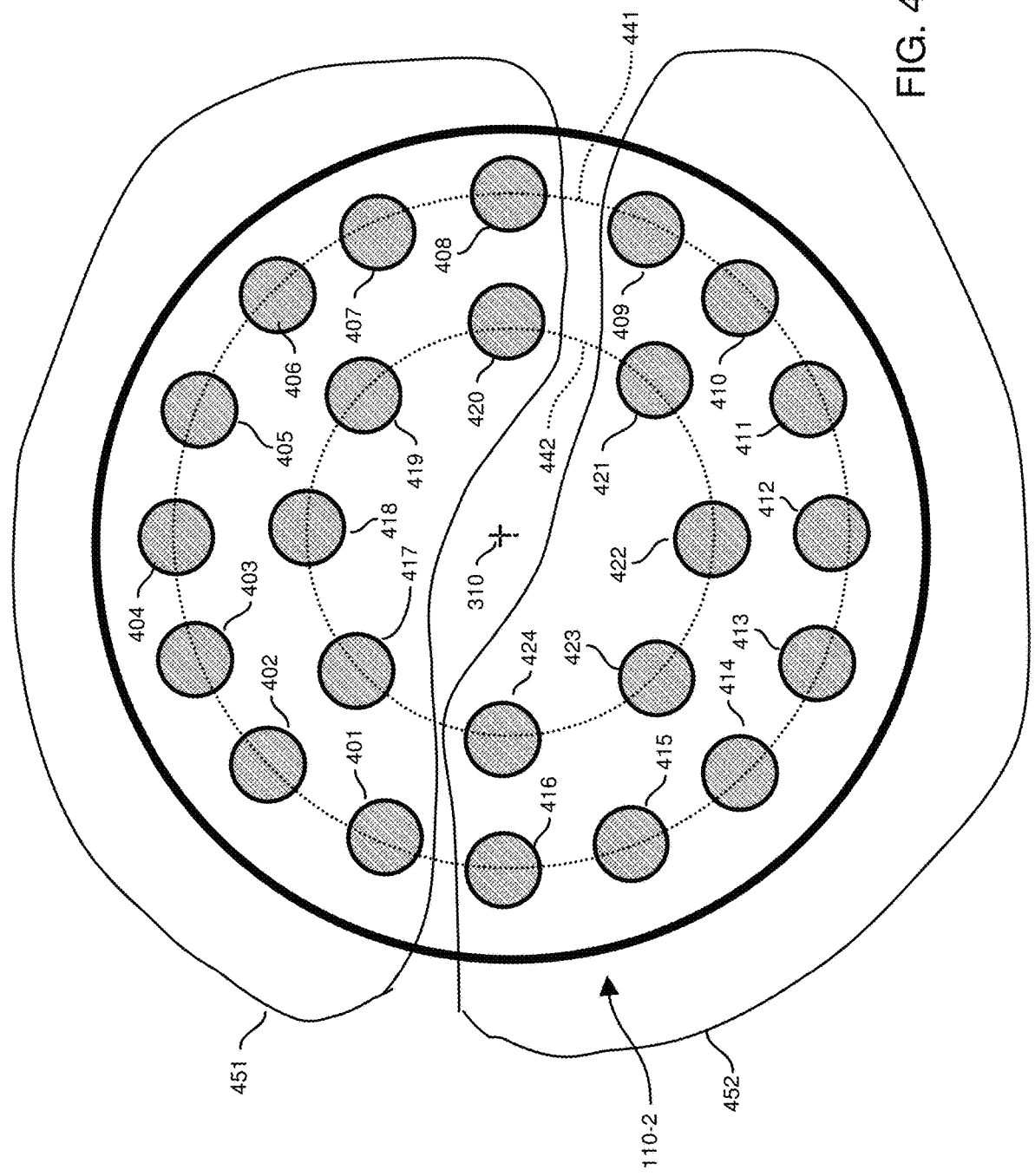

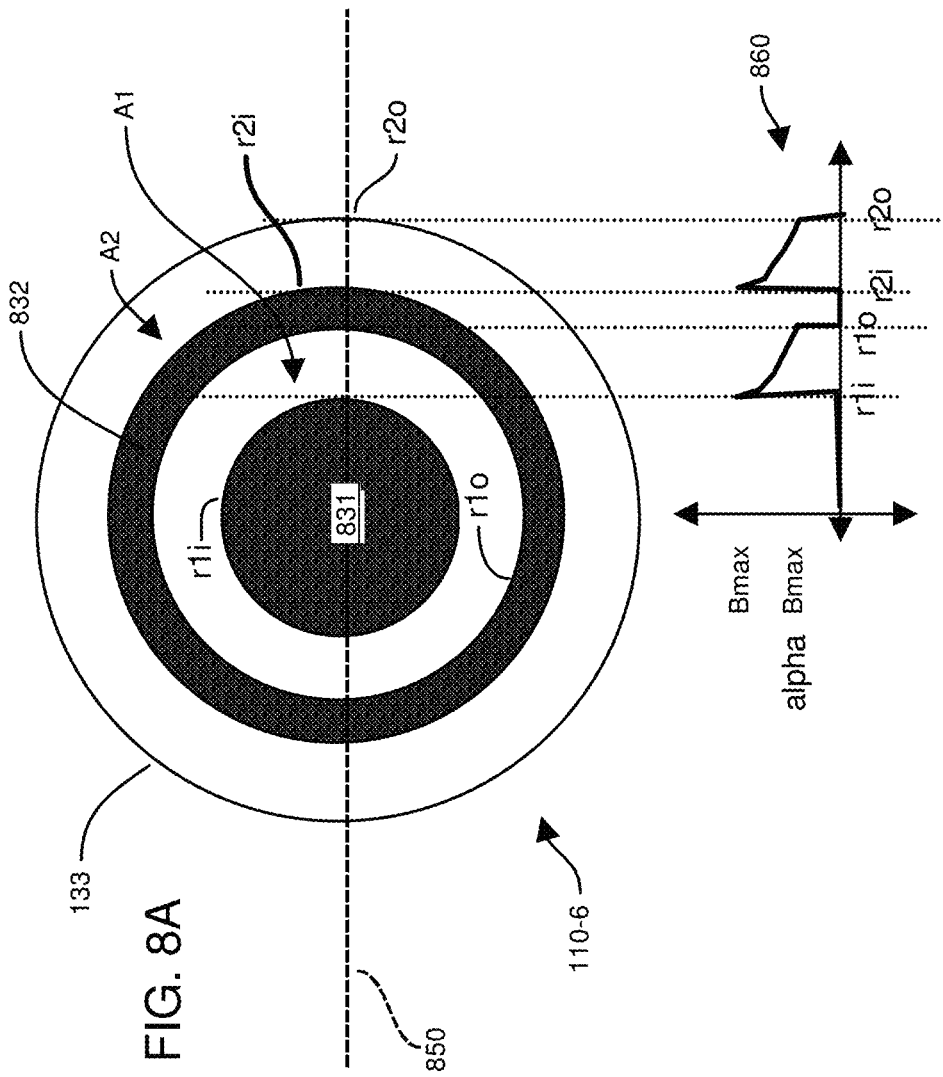

STACKED POWER SUPPLY TOPOLOGIES AND INDUCTOR DEVICES

RELATED APPLICATION

This application is a continuation application of earlier filed U.S. patent application Ser. No. 16/655,432 entitled "STACKED POWER SUPPLY TOPOLOGIES AND INDUCTOR DEVICES," filed on Oct. 17, 2019, the entire teachings of which are incorporated herein by this reference.

BACKGROUND

Conventional switching power supply circuits sometimes include an energy storage component such as an inductor to produce an output voltage that powers a load. For example, to maintain a magnitude of an output voltage within a desired range, a controller controls switching of input current through one or more inductors.

In general, a conventional inductor is a component comprising wire or other conductive material, which is shaped as a coil or helix to increase an amount of magnetic flux through a respective circuit path. Winding a wire into a coil of multiple turns increases the number of respective magnetic flux lines in a respective inductor component, increasing the magnetic field and thus overall inductance of the respective inductor component.

BRIEF DESCRIPTION

This disclosure includes the observation that conventional inductor components are suited for planar circuit applications in which a respective planar surface of a power supply circuit board is populated with multiple different components that are, in turn, coupled to each other via circuit traces disposed on the planar surface. Such topologies (providing horizontal power flow in the power supply circuit board) inevitably make it difficult to create a compact, efficient, and high current output power supply circuit. Thus, conventional power supply circuits implementing one or more inductors are undesirable.

More specifically, for a power converter providing a 1000 Amp output current target at an output voltage below 2V, the existing state of the art implements a voltage regulator via a power supply circuit implementing horizontal power flow. The main problems with conventional topologies implementing horizontal power flow are:
- A PoL (Point of Load) stage of a respective circuit cannot be moved closer to the CPU (Central Processing Unit) load because of a specific "keep-out" area due to potential disturbances of the I/O tracks needed for high frequency communication of the CPU with memory and other cores.
- Pure conduction loss of the copper tracks at the output of the VRM (Voltage Regulator Module) channeling the current into the processor,
- Close proximity and potential coupling of noise of the VRM with the data channels on either side of the output channel,
- Impedance of copper tracks limits the maximum transient response speed,
- The need for a large amount of output capacitors and cavity capacitors close to and underneath the processor in order to handle the transient responses,
- The consumption of large amounts of surface space at the side of the CPU load on a respective motherboard,
- All the above problems will become worse as dynamic current consumption of a respective load increases.

In contrast to conventional techniques, embodiments herein provide novel and improved inductor components as well as novel and improved stacked power converter topologies.

First Embodiments—Improved Inductor Components

First embodiments herein include a novel inductor device and a method of fabricating same.

For example, a fabricator fabricates an inductor device (component) to include: core material and a first electrically conductive path. The core material is magnetically permeable and surrounds (envelops) the first electrically conductive path. The first electrically conductive path (first inductive path) extends through the core material of the inductor device from a first end (such as an proximal end) of the inductor device to a second end (such as a distal end of the inductor device). The magnetically permeable core material is operative to confine (and/or guide, carry, convey, localize, etc.) first magnetic flux generated from first current flowing through the first electrically conductive path. The core material is operable to store the magnetic flux energy (i.e., first magnetic flux) generated from the current flowing through the first electrically conductive path.

In accordance with further embodiments, the fabricator fabricates the inductor device to include a second electrically conductive path (second inductive path) spaced apart from the first electrically conductive path in the core material. The second electrically conductive path extends through the core material from the first end to the second end of the inductor device. The magnetically permeable core material is operable to confine (guide, carry, convey, localize, etc.) second magnetic flux generated from second current flowing through the second electrically conductive path.

In yet further embodiments, the fabricator fabricates the inductor device to include a third electrically conductive path extending from the first end to the second end of the inductor device. The third electrically conductive path is a return path operable to convey the first current (from the first electrically conductive path) and the second current (from the second electrically conductive path) back to a reference voltage such as ground.

Further embodiments herein include fabricating the first electrically conductive path and the second electrically conductive path of the inductor device in parallel.

In yet further embodiments, the second electrically conductive path is fabricated to be magnetically coupled to the first electrically conductive path in which flow of the second current through the second electrically conductive path induces (via magnetic flux) a flow of current through the first electrically conductive path.

The coupling coefficient between the first electrically conductive path and the second electrically conductive path in the inductor device can be any suitable value. For example, in one embodiment, the inductive coupling coefficient between the first electrically conductive path and the second electrically conductive path is between 0.6 and 0.95. In certain instances, the inductive coupling may be less than 0.6 and as low as zero.

In yet further embodiments, the fabricator also fabricates the second electrically conductive path to extend from the first end of the inductor device to the second end of the inductor device; the second electrically conductive path includes a ring of metal material (or shield) in which the first electrically conductive path and the core material reside.

The core material can be made from any suitable material and have any suitable flux permeability. In one embodiment, the core material has a flux permeability of between 30-50 Henries/meter. In accordance with further embodiments, the core material has a flux permeability between 10-1000 Henries/meter.

In yet further embodiments, the fabricator fabricates the inductor device such that core material through which the first electrically conductive path passes does not include any air gaps.

In accordance with still further embodiments, the fabricator fabricates the inductor device as described herein to include a first split ring of material including a first curved layer of metal material (first inductive path) and a second curved layer of metal material (second inductive path). The first curved layer of metal material is a first electrically conductive path extending through the core material. The second curved layer of metal material is a second electrically conductive path extending through the core material. In a similar manner as previously discussed, the first split ring of material (first curved layer and second curved layer) extend from the first end (such as input end of first node) of the inductor device to the second end (such as an output end or output node) of the inductor device.

In yet further embodiments, the fabricator fabricates the inductor device to include a third curved layer of metal material and a fourth curved layer of metal material extending through the core material. The third curved layer of metal material is a third electrically conductive path (inductive path) extending through the core material. The fourth curved layer of metal material is a fourth electrically conductive path (inductive path) extending through the core material. In one embodiment, the fabricator fabricates the third curved layer of metal material and the fourth curved layer of metal material as part of a second split ring of material, portions of which are concentrically disposed with respect to the previously discussed first split ring of material (first curved layer of metal material and second curved layer of metal material in the inductor device).

Further embodiments herein include fabricating one or more electrically conductive paths in the core material to be cylinder-shaped. The core material envelops one or more electrically conductive paths (inductive paths) in the inductor device. In one embodiment, the core material is in contact with or surrounds respective surfaces of the one or more electrically conductive paths.

In yet further embodiments, the fabricator fabricates the inductor device to include a first set of electrically conductive paths which are disposed to form a first ring; the first set of electrically conductive paths includes the first electrically conductive path, each of the electrically conductive paths in the first set extending from the first end of the inductor device to the second end of the inductor device. The fabricator further fabricates the inductor device to include a second set of electrically conductive paths which are disposed in a second ring. Each of the electrically conductive paths in the second set extends from the first end of the inductor device to the second end of the inductor device. In one embodiment, the first ring of electrically conductive paths is concentric with respect to the second ring of electrically conductive paths.

In yet further embodiments, each of the one or more electrically conductive paths (such as pillars, rods, curved surfaces, etc.) through the core material of the inductor device follows a respective non-winding path from the first end of the inductor device to the second end of the inductor device. Accordingly, the one or more electrically conductive paths as described herein are simple to fabricate.

In still further embodiments, embodiments herein include a system comprising: a circuit board; one or more inductor devices as described herein. In one embodiment, the inductor device is disposed in a power converter (such as a power supply stack assembly or other suitable hardware) affixed to the circuit board; the power converter is operable to generate an output voltage (output current) that powers a load affixed to the circuit board or a load affixed to the power supply stack assembly.

Further embodiments herein include fabrication of the system. For example, embodiments herein include receiving a circuit board; affixing a power converter to the circuit board, the power converter circuit including one or more inductor devices as described herein. The power converter is operative to generate an output voltage (output current) to power a load affixed to the circuit board.

The inductor device as described herein provides advantages and is useful over conventional inductor devices. For example, the inductance provided by each of the electrically conductive paths (inductive paths) in the inductor device as described herein is easily controlled based on parameters such as: i) distance between the first end of the inductor device to the second end of the inductor device, ii) magnetic permeability of the core material, iii) number of electrically conductive paths extending through the inductor device that are connected in parallel, etc. Note further that the inductor device as described herein is simple to fabricate and provides relatively low inductance values.

Second Embodiments—Stacked Power Converter

Second embodiments herein include a novel stacked power converter and a method of fabricating same.

For example, a fabricator fabricates a power converter based on stacking of multiple components including a first power interface, one or more switches, one or more inductor devices, and a second power interface. The fabricator disposes a first power interface at a base of the stack. The fabricator couples multiple switches to the first power interface to receive power. The fabricator connects an inductor device to the multiple switches; the inductor device is operable to produce an output voltage (output current) based on the received power. The fabricator connects a second power interface to the inductor device, the second power interface operable to receive and output the output voltage (output current) produced by the inductor device.

In accordance with yet further embodiments, the fabricator disposes the one or more switches in the stack between the first power interface and the inductor device; the fabricator disposes the inductor device in the stack between the multiple switches and the second power interface.

In yet further embodiments, the fabricator fabricates the first power interface to include first contact elements operable to connect the first power interface at the base of the stack to a host substrate. The fabricator fabricates the second power interface to include second contact elements operable to affix a dynamic load to the stack.

Further embodiments herein include affixing a dynamic load to the second power interface, the second power interface operable to convey the output voltage (output current) from the inductor device to the dynamic load. Additionally, the fabricator fabricates the first power interface to couple the multiple switches to an input voltage node (from which to receive an input voltage) and a reference voltage node (from which to receive a ground reference voltage). In one embodiment, the one or more switches in the stack are vertical field effect transistors disposed between the first power interface and the inductor device.

In yet further embodiments, the fabricator disposes the multiple switches in the stack to switch between coupling an input voltage and a reference voltage received through the first power interface to one or more inductive paths of the inductor device. In one embodiment, the one or more inductive paths of the inductor device extend from the multiple switches in the stack to the second power interface in the stack.

In still further embodiments, the fabricated stack of components (such as first power interface, one or more switches, inductor device, and second power interface) is a power converter operable to convert an input voltage received at the first power interface into the output voltage (output current) outputted from the second power interface. The fabricator fabricates the inductor device to include multiple inductive paths. The fabricator disposes the multiple inductive paths in the stack between the multiple switches and the second power interface. In one embodiment, fabrication of the multiple inductive paths includes: fabricating the multiple inductive paths to include a first inductive path and a second inductive path extending through core material of the inductor device. The first inductive path is disposed in a first phase of the power converter; the second inductive path is disposed in a second phase of the power converter. During operation of the power converter, a combination of the first phase and the second phase disposed in parallel and collectively produce the output voltage (output current).

Additionally, or alternatively, in yet further embodiments, the multiple inductive paths include a first inductive path and a second inductive path: the first inductive path is disposed in a phase of the power converter, the second inductive path is magnetically coupled to the first inductive path to apply magnetic energy adjustments (providing voltage output boost capability) to the first inductive path. In such an instance, a combination of the phase and input (such as magnetic energy adjustments) from the second inductive path is operable to produce the output voltage (output current).

Yet further embodiments herein include fabricating the inductor device to include one or more inductive paths extending between a first layer of one or more switches in the stack and a second layer of the stack including the second power interface. In such an instance, each of the one or more inductive paths is a respective non-winding path extending from a first layer in the stack including the multiple switches to a second layer in the stack including the second power interface.

More specifically, the fabricator fabricates the inductive paths of the inductor device to include a first inductive path and a second inductive path. The first inductive path is fabricated as a first non-winding path extending from a first layer in the stack including the multiple switches to a second layer in the stack including the second power interface, the second inductive path is fabricated as a second non-winding path extending from the first layer in the stack including the multiple switches to the second layer in the stack including the second power interface.

In yet further embodiments, the fabricator fabricates the inductor device to include: i) core material, the core material being magnetically permeable ferromagnetic material, and ii) a first electrically conductive path extending through the core material from a first end of the inductor device to a second end of the inductor device, presence of the core material rendering the first electrically conductive path to be a first inductive path.

As previously discussed, the fabricator can be configured to fabricate any number of inductive paths (conductive paths) through the core material. In one embodiment, the fabricator fabricates the inductor device to include a second electrically conductive path extending through the core material from the first end of the inductor device to the second end of the inductor device. As discussed herein, presence of the magnetically permeable core material in the inductor device renders the second electrically conductive path to be a second inductive path.

Yet further embodiments herein include connecting multiple inductive paths such as the first inductive path and the second inductive path of an inductor device in parallel. Any number of inductive paths in the inductor device can be connected in parallel to provide a desired overall inductance. Thus, in addition to controlling parameters such as permeability of the core material, respective length of each non-winding electrically conductive path in the inductor device, etc., embodiments herein can include connecting two or more of the inductive paths in parallel to control inductance.

Yet further embodiments herein include fabricating the stack to include a second electrically conductive path extending from a first layer of the stack including the first power interface and a second layer of the stack including the second power interface, the second electrically conductive path is coupled to a reference voltage node. In one embodiment, the second electrically conductive path of the inductor device provides perimeter electromagnetic shielding.

In yet further embodiments, the fabricator: disposes a second electrically conductive path in the first layer of the stack, the second electrically conductive path is coupled to an input voltage node; the fabricator fabricates the stack to include first capacitors, the first capacitors coupled between the first electrically conductive path and the second electrically conductive path. The fabricator further disposes a third electrically conductive path in the second layer of the stack including the second power interface, the third electrically conductive path is operable to convey the output voltage (output current) such as to a dynamic load. In one embodiment, the fabricator fabricates the stack to include second capacitors in the third layer; in such an instance, the second capacitors are coupled between the third electrically conductive path and the second electrically conductive path.

Yet further embodiments herein include, via a fabricator: fabricating the multiple switches to include a first switch and a second switch; coupling a source node of the first switch to a reference voltage node of the first power interface; coupling a drain node of the first switch to an inductive path of the inductor device; coupling a drain node of the second switch an input voltage node of the first power interface; and coupling a source node of the second switch to the inductive path of the inductor device. Yet further embodiments herein include: coupling a controller to the stack. The controller is operable to control switching of the first switch and the second switch to convert an input voltage received at the input voltage node into the output voltage (output current).

In still further embodiments, embodiments herein include a system comprising: a circuit board (such as a standalone board, mother board, standalone board destined to be coupled to a mother board, etc.); a stack of components (such as power supply stack assembly) including one or more inductor devices; and a load, the load powered by the output voltage (output current). The load can be any suitable circuit such as CPUs (Central Processing Units), GPUs and ASICs (such those including one or more Artificial Intelligence Accelerators), which can be located on standalone circuit board.

Further embodiments herein include fabrication of the system. For example, embodiments herein include receiving a circuit board; affixing a base of the stack of components (such as a power supply stack assembly) to the circuit board, the stack of components operative to generate an output voltage (output current) to power a load affixed to the circuit board.

The stack (assembly such as a vertical stack) as described herein provides advantages over conventional power converters. For example, the power converter stack as described herein provides novel connectivity of components in an assembly (such as via stacking), resulting in shorter circuit paths and lower losses.

These and other more specific embodiments are disclosed in more detail below.

Note that any of the resources (such as a fabricator) implemented in system as discussed herein can include one or more computerized devices, controllers, mobile communication devices, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment includes a fabricator such as including computer readable storage medium and/or system having instructions stored thereon to fabricate an inductor device. The instructions, when executed by computer processor hardware, cause the computer processor hardware (such as one or more co-located or disparately located processor devices or hardware) to: receive core material, the core material being a magnetically permeable material; and dispose a first electrically conductive path in the core material, the first electrically conductive path extending through the core material from a first end of the inductor device to a second end of the inductor device, the core material is operable to confine first magnetic flux generated from current flowing through the first electrically conductive path.

Another embodiment as described herein includes a fabricator such as including computer readable storage medium and/or system having instructions stored thereon to fabricate a power supply stack assembly. The instructions, when executed by computer processor hardware, cause the computer processor hardware (such as one or more co-located or disparately located processor devices or hardware) to: dispose a first power interface at a base (first layer) of a stack (power supply stack assembly such as a power converter stack of components); electrically couple multiple switches (disposed at a second layer of the stack) to the first power interface to receive power; electrically connect an inductor device (disposed at a third layer of the stack) to the multiple switches, the inductor device operable to produce an output voltage (output current) based on the received power; and electrically connect a second power interface (disposed at a fourth layer of the stack) to the inductor device, the second power interface operable to receive and output the output voltage (output current) produced by the inductor device.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Note further that although embodiments as discussed herein are applicable to switching power supplies, the concepts disclosed herein may be advantageously applied to any other suitable topologies.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

BRIEF DESCRIPTION OF THE DRAWINGS

FIG. 1A is an example diagram illustrating a three-dimensional (see-through) view of an inductor device according to embodiments herein.

FIG. 1B is an example diagram illustrating a top view of an inductor device according to embodiments herein.

FIG. 1C is an example three-dimensional diagram illustrating an inductor device according to embodiments herein.

FIG. 1D is an example diagram illustrating different combinations of connecting the inductive paths (conductive paths) of an inductor device according to embodiments herein.

FIG. 4 is an example top view diagram of an inductor device including multiple conductive paths (inductive paths) connected in parallel according to embodiments herein.

FIG. 8A is an example top view diagram of an inductor device according to embodiments herein.

FIG. 8B is an example diagram illustrating flux density in the inductor device of FIG. 8A according to embodiments herein.

Figure 2:
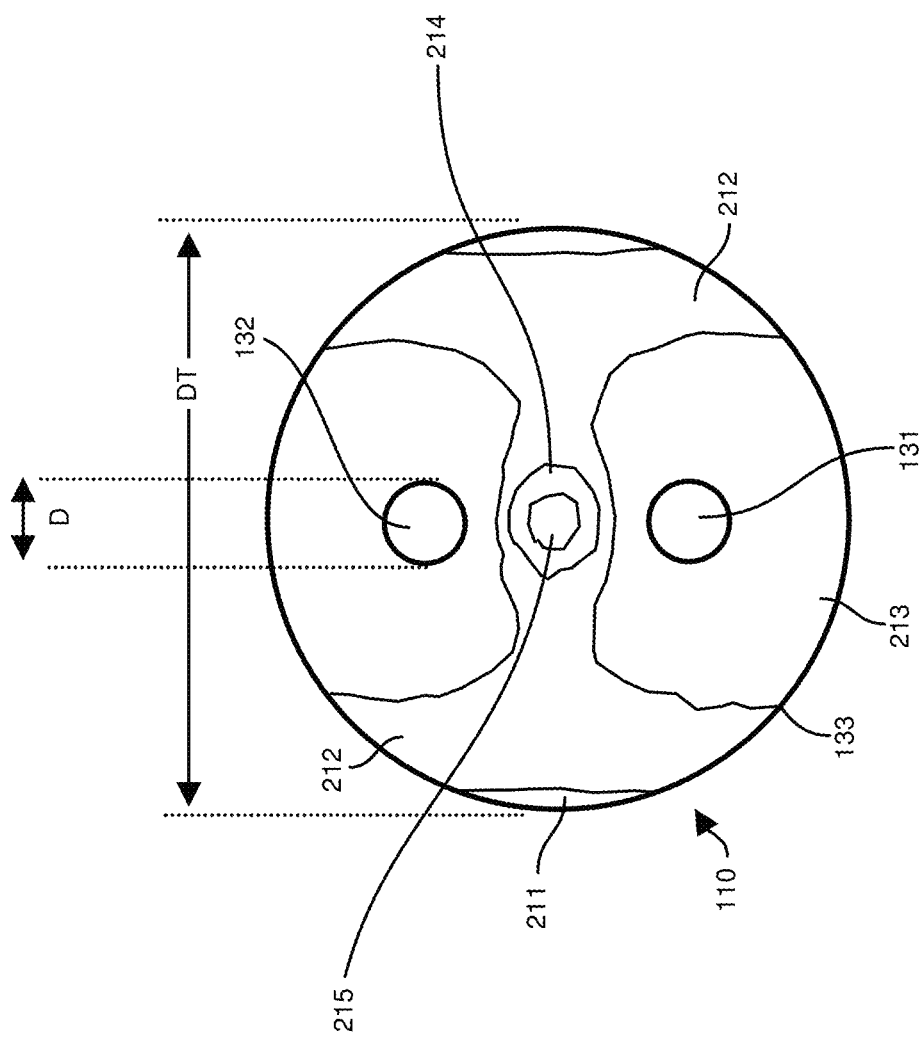
FIG. 2 in an example diagram illustrating magnitudes of magnetic flux density in core material of an inductor device according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

First embodiments herein include a novel and improved inductor device. The inductor device comprises: core material and one or more electrically conductive paths. The core material is magnetically permeable and surrounds (envelops) the one or more electrically conductive paths. Each of the electrically conductive paths extends through the core material of the inductor device from a first end of the inductor device to a second end of the inductor device. The magnetically permeable core material is operative to confine (guide, carry, convey, localize, etc.) respective magnetic flux generated from current flowing through a respective electrically conductive path. The core material stores the magnetic flux energy (i.e., first magnetic flux) generated from the current flowing through the first electrically conductive path. In one embodiment, the inductor device includes a second electrically conductive path.

Second embodiments herein include a power converter assembly comprising a stack of components. The stack of components includes a first power interface, multiple switches, an inductor device, and a second power interface. The first power interface is disposed at a base of the stack. The multiple switches are coupled to the first power interface to receive power. The one or more inductor devices are connected to the multiple switches. The inductor device is operable to produce an output voltage (output current) based on the received power from the switches. The second power interface is connected to the inductor device, the second power interface is operable to receive the output voltage (output current) from the one or more inductor devices and output the output voltage (output current) to a dynamic load.

Embodiments herein address, but are not limited to solving the problems of providing reduced processor core voltages (lower source voltages) while also providing continued regulation despite large transient current consumption swings. One goal of the embodiments herein is to accommodate quick power consumption such as changes between 0 and 1000 Amps, while maintaining regulation of a respective power supply output voltage (output current).

Certain embodiments herein include fabricating and disposing a last power stage (such as a DC-DC converter or commonly known as VRM or Point-of-Load converter) of a power supply directly under the dynamic processor load. In contrast to conventional techniques, such an implementation provides vertical power flow instead of conventional horizontal power flow as previously discussed. Locating the power converter assembly (such as a stack) directly beneath the dynamic load as described herein provides advantages over conventional techniques such as:

Significant reduction in conduction loss between the output of a respective DC-DC converter and the dynamic load processor, Significant reduction in noise coupling from the DC-DC converter assembly to data signals, Significant improvements in transient responses (such as quickly increasing or decreasing an amount of current delivered to a load, Significant reduction in the need for cavity/output capacitors, Improvement in overall power density, Freeing up immediate mother board space next to the dynamic load processor for other peripheral components or circuit assemblies.

More specifically, embodiments herein can achieve the smallest power loop possible by operating mainly via vertical power flow which significantly reduces parasitic inductance and the switching losses associated with it.

Now, with reference to the drawings, FIG. 1A is an example diagram illustrating a three-dimensional view of an inductor device according to embodiments herein.

As shown, the inductor device 110 in FIG. 1A includes: core material 120 and electrically conductive paths 131 and 132. Core material 120 envelops (surrounds) each of the conductive paths 131 and 132. If desired, each of the conductive paths 131 and 132 is surrounded with a layer of insulative material (such as non-electrically conductive material so as not to come in contact with the core material 120). This transforms the conductive path 131 into a first inductive path; this transforms the conductive path 132 into a second inductive path.

The core material 120 surrounding electrically conductive paths 131 and 132 is magnetically permeable. The core material can be made from any suitable material. In one embodiment, by way of non-limiting example embodiment, the core material 120 has a flux permeability between 25-60 Henries/meter.

In yet further embodiments, a fabricator 140 as described herein fabricates the inductor device 110 such that core material 120 through which the first electrically conductive path 131 passes does not include any air gaps or voids that are not filled with magnetically permeable material.

As further discussed herein, the inductor device 110 can be fabricated to include any number of conductive paths disposed within surrounding conductive path 133.

In yet further embodiments, each of the electrically conductive paths 131, 132, and 133 is made from any suitable conductive material such as metal, metal alloy, etc.

In yet further embodiments, each of the electrically conductive paths 131 and 132 extends through the core material 120 of the inductor device 110 from a first axial end 141 (a.k.a., such as a first facing, interface, etc.) of the inductor device 110 to a second axial end 142 (such as a second facing, interface, etc.) of the inductor device 110. Accordingly, in one embodiment, inductor device 110 is an axial device have an input axial end 141 and an output axial end 142.

Electrically conductive paths 131 and 132 can be fabricated as any suitable shape such as rod-shaped, pillar shaped, curved surfaces, rings, split rings, etc. In one embodiment, each of the electrically conductive paths is a non-winding circuit path extending through the inductor device 110. Note that, regardless of the embodiment, the overall shape of the inductor device is cylindrical (in a strict geometric sense, as in generated by a generatrix), although further embodiments herein implementing the inductor device and corresponding elements in any suitable shape, size or manner.

FIG. 1B is an example diagram illustrating a top view of an inductor device according to embodiments herein.

As shown in the top view of the inductor device 110, each of the electrically conductive paths 131 and 132 resides within the confines of the surrounding electrically conductive path 133, which encompasses a perimeter (via a curved shielding layer) of the inductor device 110.

Thus, embodiments herein include fabricating the electrically conductive path 133 to extend from the first end 141 of the inductor device 110 to the second end 142 of the inductor device 110; the second electrically conductive path 133 can be a ring of metal material in which the first electrically conductive paths 131 and 132 as well as core material 120 resides.

FIG. 1C is an example three-dimensional diagram illustrating an inductor device according to embodiments herein.

This example embodiment illustrates a flow of current through each of the electrically conductive paths 131, 132, and 133.

For example, the current 151 flows through electrically conductive path 131 (in an upward direction). According to the right-hand rule, the current 151 flowing through the electrically conductive path 131 generates the magnetic flux 161, which permeates a respective first portion of the core material 120 in the inductor device 110.

As further shown, the current 152 flows through the electrically conductive path 132 (in an upward direction). According to the right-hand rule, the current 152 flowing through the electrically conductive path 132 generates the magnetic flux 162, which permeates a respective second portion of the core material 120 in the inductor device 110.

In one embodiment, the first conductive path 131 is magnetically coupled to the second conductive path 132.

In one embodiment, the electrically conductive path 133 provides a return path for a combination of current 151 and current 152 (such as current delivered to a load). As shown, the electrically conductive path 133 carries current 153 (return current from the load) in the downward direction.

The direction of currents 151, 152, and 153 is shown by way of a non-limiting example embodiment. Note that the currents 151, 152, and 153 can flow in any direction.

In accordance with further embodiments, the magnetically permeable core material 120 of the inductor device 110 is operative to confine (guide, carry, convey, localize, etc.) respective magnetic flux 161 and 162 generated from currents flowing through the respective electrically conductive path 131 and 132.

For example, the core material 120 at least temporarily stores the first magnetic flux energy 161 (i.e., magnetic flux) generated from the current 151 flowing through the first electrically conductive path 131; the core material 120 stores the first magnetic flux energy 162 (i.e., magnetic flux) generated from the current 152 flowing through the second electrically conductive path 132; and so on.

Presence of the core material 120 renders the conductive path 131 to be a first inductive path extending through the core material 120 from the first end 141 (or facing) of the inductor device 110 to the second end 142 (or facing) of the inductor device 110.

In yet further embodiments, the second electrically conductive path 132 is fabricated to be magnetically coupled to the first electrically conductive path 131 in which flow of the second current 152 through the second electrically conductive path 132 induces (via coupling of magnetic flux) a flow of current 151 through the first electrically conductive path 131.

Note that the coupling coefficient between the first electrically conductive path 131 and the second electrically conductive path 132 in the inductor device 110 can be any suitable value. For example, in one embodiment, the inductive coupling coefficient between the first electrically conductive path 131 and the second electrically conductive path 132 is between 0.6 and 0.95. In yet further embodiments, the first conductive path 131 is network of the magnetically coupled to the second conductive path 132.

In yet further embodiments, each of the one or more electrically conductive paths 131, 132, etc., (such as pillars, rods, etc.) through the core material 120 of the inductor device 110 follows a respective non-winding path from the first end 141 to the second end 142 of the inductor device 110. Accordingly, the one or more electrically conductive paths 131, 132, etc., as described herein are simple to fabricate.

The inductor device as described herein provides advantages over conventional inductor devices. For example, the inductance provided by each of the electrically conductive paths in the inductor device is easily controlled based on parameters such as: i) distance, d, between the first end 141 of the inductor device 110 to the second end 142 of the inductor device, ii) magnetic permeability of the core material 120, iii) number of electrically conductive paths through the inductor device 110 that are connected in parallel, etc. The inductor device 110 as described herein is simple to fabricate and provides relatively low inductance values for application in any circuit. In one embodiment, as further discussed herein, the inductor device 110 is suitable for use in a stacked circuit such as a power converter circuit.

Note that, in one embodiment, the inductor device 110 (such as a so-called tubecore) is basically a low/flat profile coupled inductor component (including one or more inductive paths) that operates with vertical current flow. The inductor device 110 can include any number of electrically conductive paths (such as 2 or higher).

FIG. 1D is an example diagram illustrating different combinations of connecting the inductive paths (conductive paths) of an inductor device according to embodiments herein.

Further embodiments herein include fabricating the first electrically conductive path and the second electrically conductive path of the inductor device 110 to be connected in parallel such as indicated by the instantiation 191 (of the inductor device 110) in FIG. 1D.

Further embodiments herein include fabricating the first electrically conductive path and the second electrically conductive path of the inductor device 110 such that the electrically conductive paths 131 and 132 are connected at the second end 142 but not the first end as indicated by the instantiation 192 (of the inductor device 110) in FIG. 1D.

Further embodiments herein include fabricating the first electrically conductive path 131 and the second electrically conductive path 132 of the inductor device 110 such that the electrically conductive paths 131 and 132 are not connected at the first end 141 and not at the second end 142 as indicated by the instantiation 193 (of the inductor device 110) in FIG. 1D.

Referring again to FIG. 1C, in one embodiment, both currents 151 and 152 can be configured to flow through the electrically conductive paths 131 and 132 in the same direction (such as from first end 141 to second end 142 of from the second end 142 to the first end.

Note that, as further discussed herein, the electrically conductive paths 131 and 132 (such as pillars, posts, etc.) can be implemented in any suitable manner (such as rings, co-centric or concentric rings structures, etc.).

In the example embodiment of FIG. 1C, the multiple electrically conductive paths 131 and 132 are surrounded by a core material 120. Each of the conductive paths can be electrically isolated from the core material 120 via a layer of insulation material between the conductive path and the core material 120.

Outside of this core material 120 is the return path or ground connection (such as electrically conductive path 133 as previously discussed). This return path (electrically conductive path 133) can be made directly touching the core material 120 or it can be isolated with respect to the core material 120 using a layer of insulation material that is not part of the core material 120.

In accordance with further embodiments, the thickness, d of the inductor device 110 (tubecore) can be adjusted to suit the need of the application. For example, changing the thickness, d, changes the value of inductance associated with the inductor device 110. In one embodiment, since the two currents 151 and 152 induce the same flux orientation around themselves in the core material 120, the area directly between the two electrically conductive paths 131 and 132 has opposing flux. The flux in these areas hence is cancelled in case the two currents have the same value or is at least reduced in case currents are not the same.

FIG. 2 in an example diagram illustrating a top view (finite element method—FEM) simulation of magnetic flux density in core material of an inductor device according to embodiments herein.

In this example embodiment, the flux density simulation assumes parallel connectivity of the electrically conductive path 131 and electrically conductive path 132 in which 60 Amps passes through each electrically conductive path.

The core material 120 has a relative permeability ($\mu r$) of approximately 40. Further in this example simulation embodiment, the diameter, D, of each electrically conductive path 131 and 132 is 1.5 mm (millimeters), the diameter DT of the inductor device 110 is 10 mm, the thickness (d as in FIG. 1A, from first end 141 to second end 142) of the inductor device 110 is 4 mm. The resulting inductance associated with the parallel conductive paths 131 and 132 is approximately 32 nH (nano-Henries).

In general, the region 214 and region 215 indicate low flux density indicating flux cancelling occurring in the regions between the two electrically conductive paths 131 and 132.

More specifically, simulation of the inductor device 110 in FIG. 2 indicates that shaded region 211 has an approximate magnetic flux density of 0.072 Tesla; shaded region 212 has an approximate magnetic flux density of 0.215 Tesla; region 213 has an approximate magnetic flux density of 0.310 Tesla; region 214 has an approximate magnetic flux density 0.072 Tesla; region 215 has an approximate magnetic flux density of 0.010 Tesla; and so on.

Figure 3A:
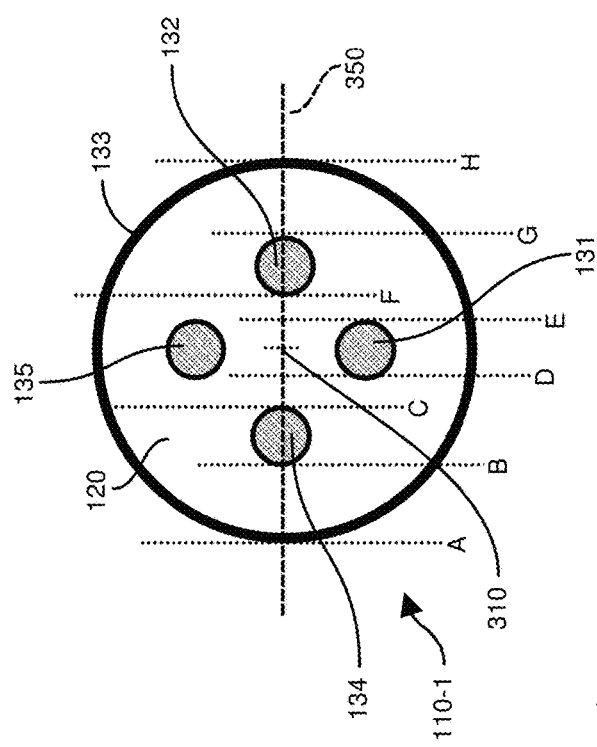
FIG. 3A is an example top view diagram of an inductor device (inductor assembly) according to embodiments herein.

FIG. 3A is an example top view diagram of an inductor device (inductor assembly) according to embodiments herein.

This example embodiment illustrates a unique inductive path arrangement in which four electrically conductive paths are connected to a single phase of a switching power supply (such as a buck converter). In this example embodiment, the core utilization is higher and the flux cancellation is extended to a larger area at the center of the core of the inductor device 110 due to the ring formation of the four electrically conductive paths (131, 132, 134, and 135) in which each electrically conductive path is spaced at the same distance from each other and as well as from the center 310.

Figure 3B:
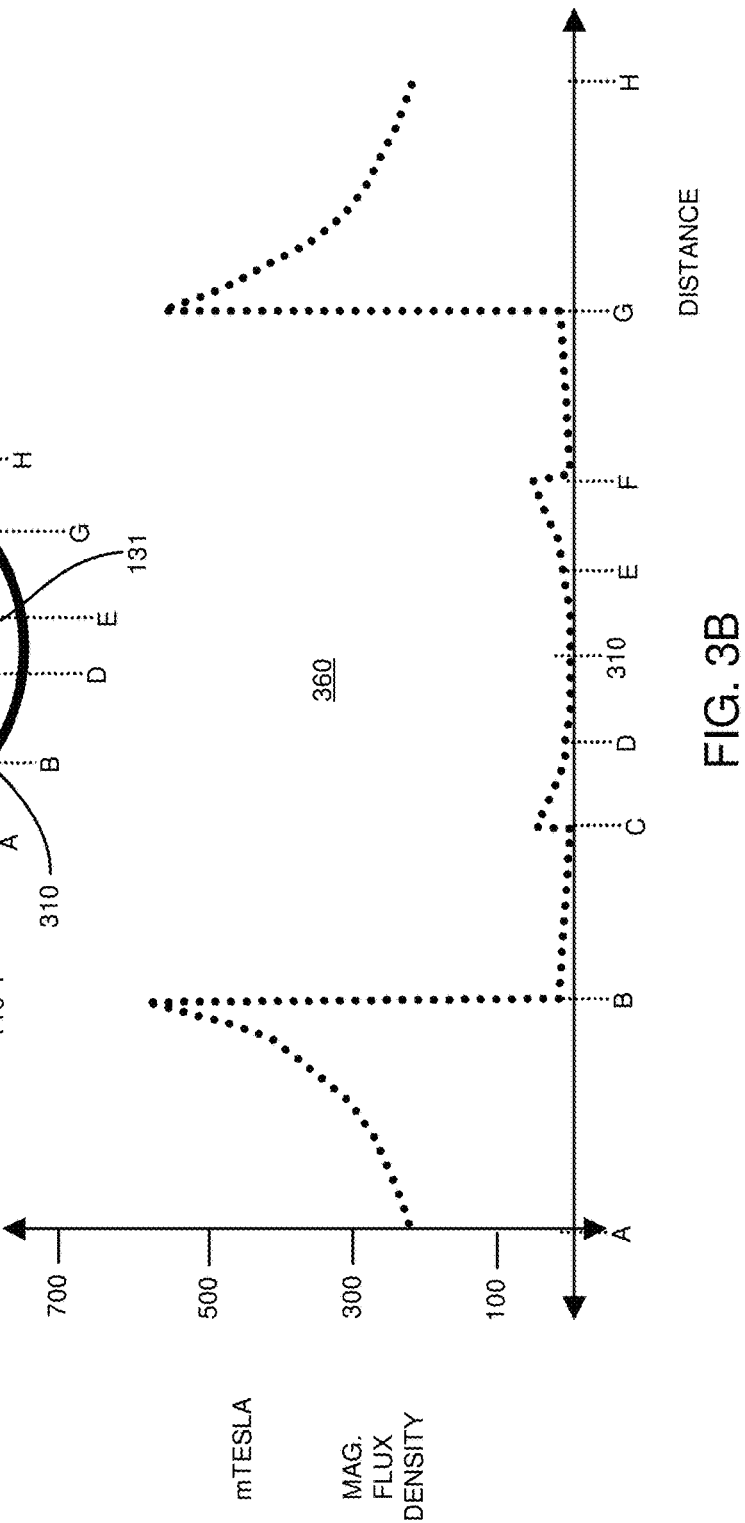
FIG. 3B is an example diagram illustrating magnetic flux density in the inductor device of FIG. 3A according to embodiments herein.

FIG. 3B is an example diagram illustrating flux density in the inductor device of FIG. 3A according to embodiments herein.

The graph 360 in FIG. 3B shows the magnetic flux density across the cross section of the inductor device 110 (tube-core) as indicated by the cross section 350. For example, the magnetic flux density in the core material 120 along the cross section is approximately zero between length B-C, length D-E, and length F-G. Peak magnetic flux density occurs around locations B and G, tapering at further distances from the center 310.

Presence of four electrically conductive paths 131, 132, 134, and 135 (instead of one or two electrically conductive paths) allows flow of more current, reducing an amount of peak magnetic flux. This simulation (current through electrically conductive paths in the inductor device 110-1) assumes a two phase common output connection in which two electrically conductive paths are disposed in each power supply phase. In this example embodiment, the effective inductance of each pair of electrically conductive paths (such as 132 and 135 or 131 and 134) is approximately 33 nH, the magnetic coupling coefficient is 0.34.

FIG. 4 is an example top view diagram of an inductor device including multiple conductive paths (inductive paths) according to embodiments herein.

This embodiment of the inductor device 110-2 includes 24 electrically conductive paths (401, 402, . . . 424).

The first concentric ring 441 (centered about center 310) of electrically conductive paths includes electrically conductive path 401, 402, 403, 404, 405, 406, 407, 408, 409, 410, 411, 412, 413, 414, 415, and 416. The second concentric ring 442 (centered about center 310, and concentric with the first ring 421) of electrically conductive paths includes electrically conductive path 417, 418, 419, 420, 421, 422, 423, and 424.

The group of electrically conductive paths 451 including electrically conductive paths 401, 402, 403, 404, 405, 406, 407, 408, 417, 418, 419, and 420, are connected in parallel. The group of electrically conductive paths 452 including electrically conductive paths 409, 410, 411, 412, 413, 414, 415, 416, 421, 422, 423, and 424, are connected in parallel.

In such an instance, each phase includes twelve electrically conductive paths (inductive paths) connected in parallel.

Such an embodiment is useful because the magnetic flux has been shaped so that more core area experiences some form of flux cancellation, not just at the center 310 of the core but also between electrically conductive paths in the outer ring 421. Additionally, the peak flux associated with inductor device 110-2 has also been significantly reduced to reduce core losses. A potential downside of this embodiment is that when more electrically conductive paths are implemented in the inductor device 110-2, the effective inductance becomes lower. In this case, the resulting inductance is approximately 9 nH for each of the groups 451 and 452; the magnetic coupling coefficient between the first group 451 and the second group 452 is 0.27.

Figure 5:
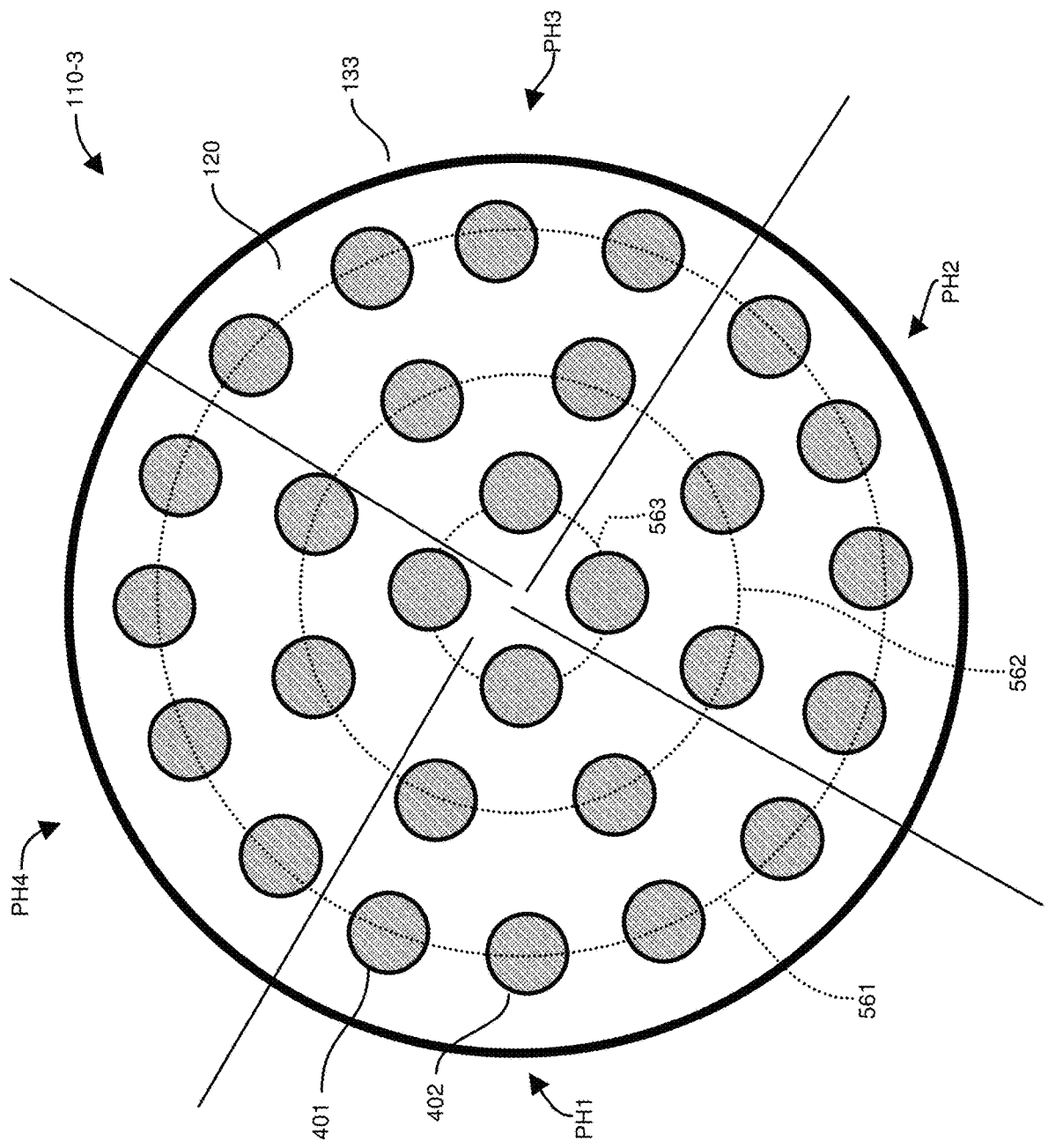
FIG. 5 is an example top view diagram illustrating multiple conductive paths in an inductor device according to embodiments herein.

FIG. 5 is an example top view diagram illustrating multiple conductive paths in an inductor device according to embodiments herein.

The instance of inductor device 110-3 in FIG. 5 illustrates an arrangement in which 28 separate electrically conductive paths are separated into 4 different sets (PH1, PH2, PH3, and PH4) of conductive paths connected in parallel. In one embodiment, each of the electrically conductive paths in the inductor device 110-3 is a non-winding inductive path extending from the first end 141 to a second end of the inductor device as previously discussed.

For example, phase PH1 includes (seven) electrically conductive paths 401, 402, 403, 404, 417, 418, and 425, connected in parallel.

Phase PH2 includes (seven) electrically conductive paths 405, 406, 407, 408, 419, 420, and 426, connected in parallel.

Phase PH3 includes (seven) electrically conductive paths 409, 410, 411, 412, 421, 422, and 427, connected in parallel.

Phase PH4 includes (seven) electrically conductive paths 412, 413, 414, 415, 423, 424, and 428, connected in parallel.

Thus, the inductor device 110-3 in FIG. 5 shows an arrangement of 28 separate electrically conductive paths passing through the core material 120 from the first end 141 to the second end 142 of the inductor device 110-3. The 28 electrically conductive paths of inductor device 110-3 are arranged in three concentric rings about center 310. The concentric rings include rings 561, 562, and 563.

As shown, ring 561 includes sixteen electrically conductive paths.

Ring 562 includes eight electrically conductive paths.

Ring 563 includes four electrically conductive paths.

The implementation of inductor device 110-3 utilizes the entire core with very effective flux cancellation. Additionally, the peak flux is further reduced to 331 mT. Here, each phase has an approximate effective inductance of 15 nH. The magnetic coupling coefficient between phases is 0.32.

Figure 6:
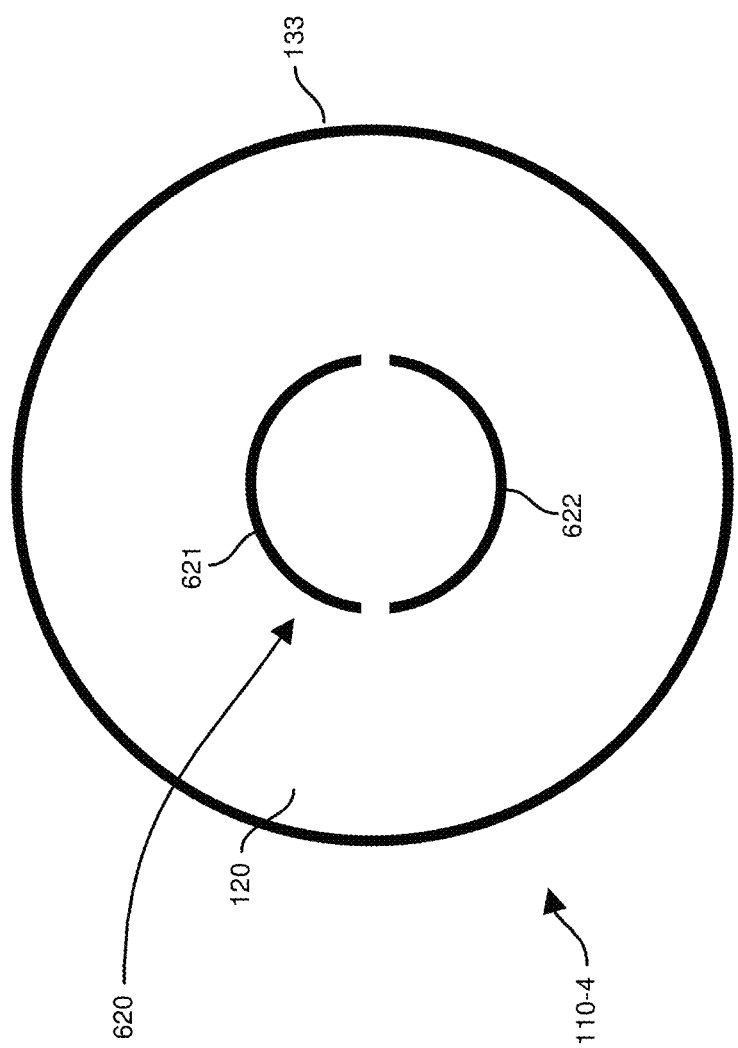
FIG. 6 is an example top view diagram illustrating arc-shaped or concentric-shaped conductive paths in an inductor device according to embodiments herein.

FIG. 6 is an example top view diagram illustrating arc-shaped conductive paths in an inductor device according to embodiments herein.

The pillar-shaped electrically conductive paths 131, 132, etc., as previously discussed is just one example embodiment; embodiments herein include other shapes as well.

For example, ring shapes are especially optimal in terms of maximum current handling and with further optimization, peak flux reduction due to flux shaping. FIG. 6 is an example diagram illustrating a split ring design in which a single ring is cut in the middle into two half electrically conductive path rings 621 and 622 (such as one electrically conductive path per phase), each conductive path 621 and 622 handling half the total current conveyed through the inductor device 110.

In this example embodiment, the core area within the ring (such as inside of electrically conductive path 621 and electrically conductive path 622) has nearly no flux at all. However, the outer edge of the electrically conductive paths 621 and 622 experience very high peak density magnetic flux. In one example embodiment, the inductance of the split ring 620 is 38 nH, the coupling coefficient between electrically conductive path 621 and electrically conductive path 622 is 0.57.

Thus, in the embodiment shown in FIG. 6, the fabricator 140 fabricates the inductor device 110-4 as described herein to include a first split ring 620 including a first curved layer of metal material (such as electrically conductive path 621) and a second curved layer of metal material (such as electrically conductive path 622).

The first curved layer of metal material (from the top view of inductor device 110-4 in FIG. 6) is a first electrically conductive path 621 extending through the core material 120 from the first end 141 of the inductor device 110-4 to the second end 142 of the inductor device 110-4.

The second curved layer of metal material (from the top view of inductor device 110-4 in FIG. 6) is a second electrically conductive path 622 extending through the core material 120 from the first end 141 of the inductor device 110-4 to the second end 142 of the inductor device 110-4.

Figure 7:
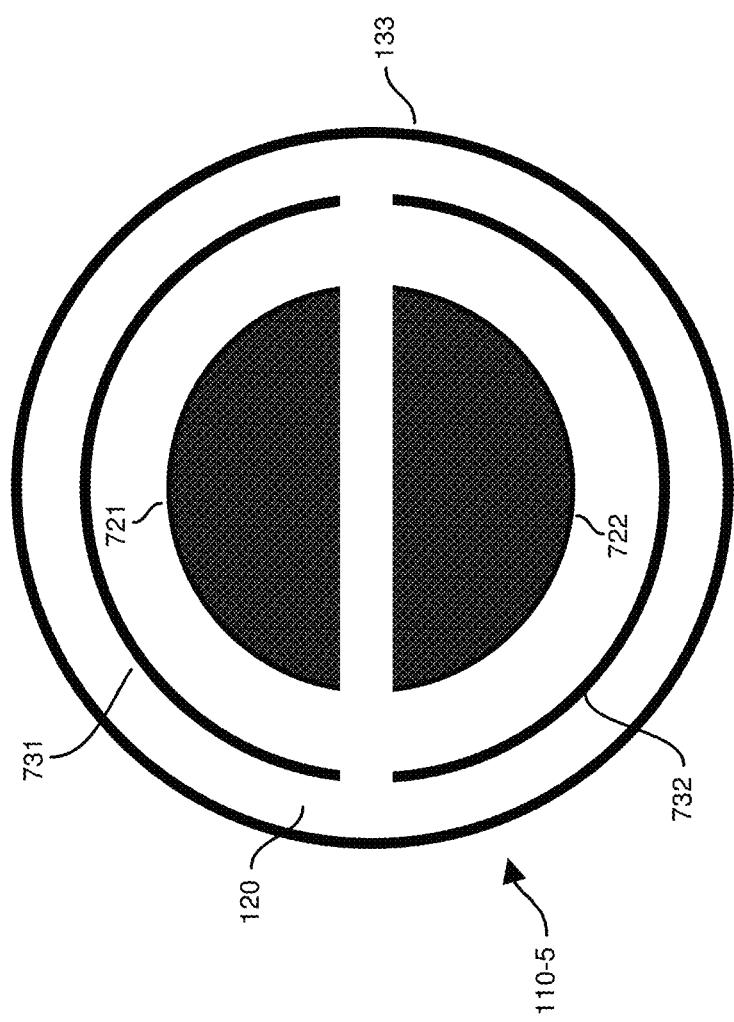
FIG. 7 is an example top view diagram illustrating arc-shaped conductive paths disposed in an inductor device according to embodiments herein.

FIG. 7 is an example top view diagram illustrating arc-shaped conductive paths disposed in an inductor device according to embodiments herein.

This example embodiment includes a concentric formation including a first split circle (top view of electrically conductive paths 721 and 722) and a split ring (top view of electrically conductive paths 731 and 732).

In one embodiment, the half-ring electrically conductive path and half-circle electrically conductive path on either the upper or lower half are parallel connected to form a phase, having therefore a two phases inductor.

For example, one embodiment herein includes connecting electrically conductive paths 721 and 731 in parallel as well as connecting electrically conductive paths 722 and 732 in parallel.

Thus, in yet further embodiments, the fabricator 140 fabricates the inductor device 110-5 to include a first electrically conductive path 731 (first curved layer of metal material) and a second electrically conductive path 732 (second curved layer of metal material) extending through the core material 120 from the first end 141 to the second end 142 of the inductor device 110-5. As shown, the fabricator 140 fabricates the first curved layer of metal material (such as electrically conductive path 731) and the second curved layer of metal material (such as electrically conductive path 732) as part of a second split ring of material concentrically disposed with respect to the split cylinder including electrically conductive path 721 (first half of the split cylinder) and electrically conductive path 722 (second half of the split cylinder).

In this example embodiment, the peak flux is reduced while utilizing most of the core area. However, in one nonlimiting example embodiment, the resulting per-phase inductance become very low at 13 nH and coupling coefficient of 0.73.

FIG. 8A is an example top view diagram of inductor device according to embodiments herein.

Embodiments herein can include analyzing flux density. Based on Ampere's law, following equations can be found for the inductor device of FIG. 8A:

$$I_1 = 2\pi r_{1i} \frac{B_{max}}{\mu}$$

$$I_1 = 2\pi r_{1o} \frac{\alpha B_{max}}{\mu}$$

$$I_1 + I_2 = 2\pi r_{2i} \frac{B_{max}}{\mu}$$

$$I_1 + I_2 = 2\pi r_{2o} \frac{\alpha B_{max}}{\mu}$$

Where $\alpha$ defines the inequality factor describing the drop of the B-field with a core section; where I1 is current through A1 (electrically conductive path fabricated from metal such as copper); where I2 is current through A2 (electrically conductive path fabricated from metal such as copper); where $\mu$ is the permeability of the core material 120. Furthermore, in order to derive the currents in each copper section, the total phase current is split up according to the copper areas relative to the total copper area:

$$I_1 = I_{tot} \frac{A_1}{A_{tot}}$$

$$I_2 = I_{tot} \frac{A_2}{A_{tot}}$$

Where Atot is total area A1 (associated with electrically conductive path 831) and area A2 (associated with electrically conductive path 832) and in which current can be expressed as functions of the radii. In the next step, the equations can be solved to find the radii.

This design logic can be further utilized to push the inductance up to a required value; this can be achieved by adjusting the thickness of the ring shaped electrically conductive paths, increasing the number of rings of electrically conductive paths, etc.

FIG. 8B is an example diagram illustrating flux density in the inductor device of FIG. 8A according to embodiments herein.

Graph 850 illustrates a density of magnetic of flux across cross section 850 of inductor device 110-6. As shown in graph 860, the magnetic flux density of the inductor device 110-6 is at a peak near radius r1i, which tapers between r1i and r1o. The magnetic flux density of the inductor device 110-6 is at a peak near radius r2i, which tapers between r2i and r2o.

Figure 9A:
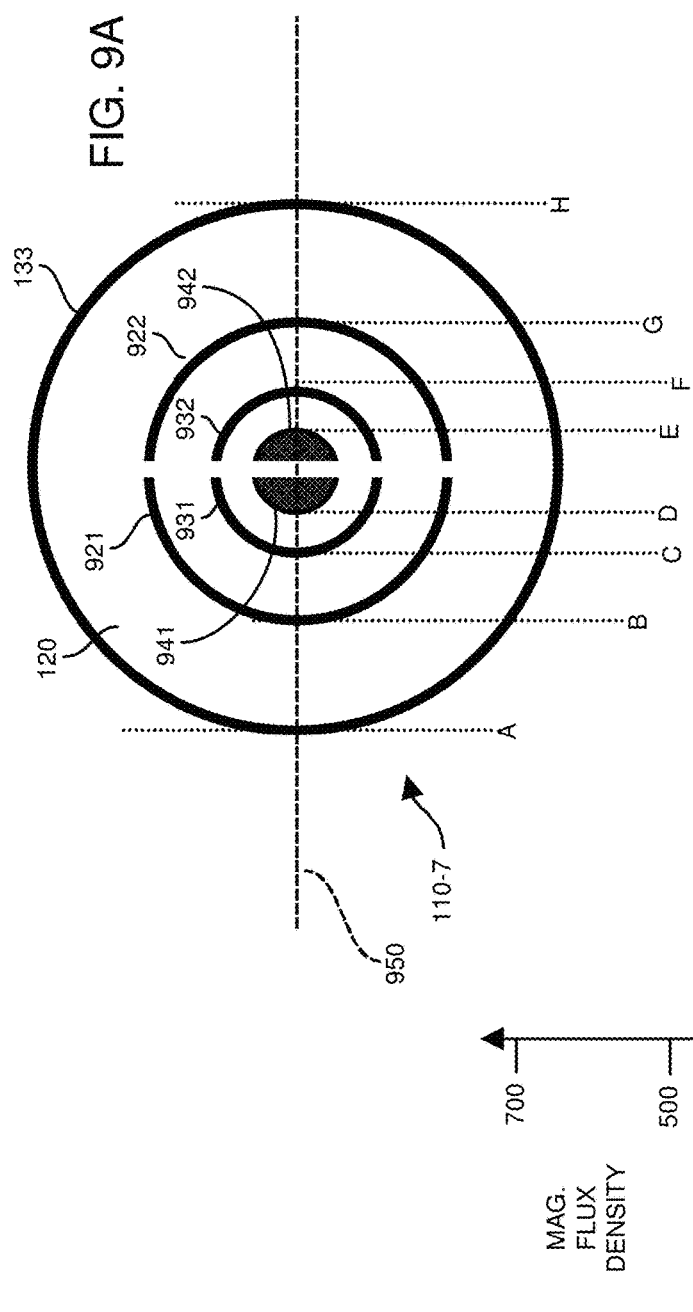
FIG. 9A is an example diagram illustrating arc-shaped conductive paths (inductive paths) disposed in an inductor device according to embodiments herein.

FIG. 9A is an example diagram illustrating arc-shaped conductive paths (inductive paths) disposed in an inductor device according to embodiments herein.

Inductor device 110-7 is an improved design in which the per-phase inductance is 35 nH, while the magnetic flux density is equalized (<400 mT) for each of the electrically conductive paths. The core space in the center 310 between the split circle (electrically conductive path 941 and electrically conductive path 942) is fully flux cancelled and the flux density at the core area between rings (such as electrically conductive paths 921, 922, 923, and 924) are substantially reduced. In this example embodiment, the magnetic coupling coefficient between electrically conductive paths is 0.74.

Thus, further embodiments herein include fabricating one or more electrically conductive paths (such as electrically conductive paths 941 and 942) the core material 120 to be cylinder-shaped or half cylinder-shaped. The core material 120 envelops these electrically conductive paths.

Thus, in this embodiment, the fabricator 140 fabricates the inductor device 110-7 to include a first set of electrically conductive paths 921 and 922 which are disposed to form a first discontinuous ring; each of the electrically conductive paths 921 and 922 in the first set extend from a first axial end of the inductor device 110-7 to a second axial end of the inductor device 110-7.

The fabricator 140 further fabricates the inductor device 110-7 to include a second set of electrically conductive paths 931 and 932, which are disposed in a second discontinuous ring about the center 310. In a similar manner as previously discussed, each of the electrically conductive paths 931 and 932 in the second set extends from the first axial end of the inductor device 110-7 to the second axial end of the inductor device 110-7. In one embodiment, the first discontinuous ring of electrically conductive paths 921 and 922 is concentric with respect to the second discontinuous ring of electrically conductive paths 931 and 932. Each of the electrically conductive paths 941 and 942 is half cylinder-shaped.

Figure 9B:
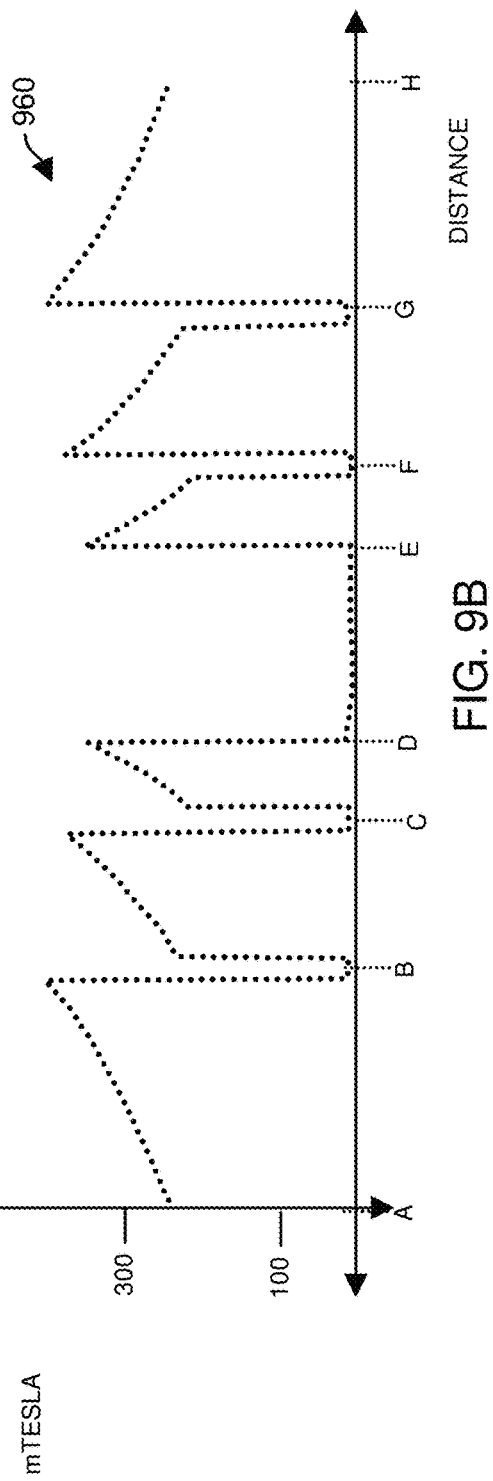
FIG. 9B is an example diagram illustrating density of magnetic flux in the inductor device of FIG. 9A according to embodiments herein.

FIG. 9B is an example diagram illustrating density of magnetic flux in the inductor device of FIG. 9A according to embodiments herein.

As shown in graph 960, the magnitude of the magnetic flux density varies along the cross section 950 of the inductor device 110-7.

Figure 10A:
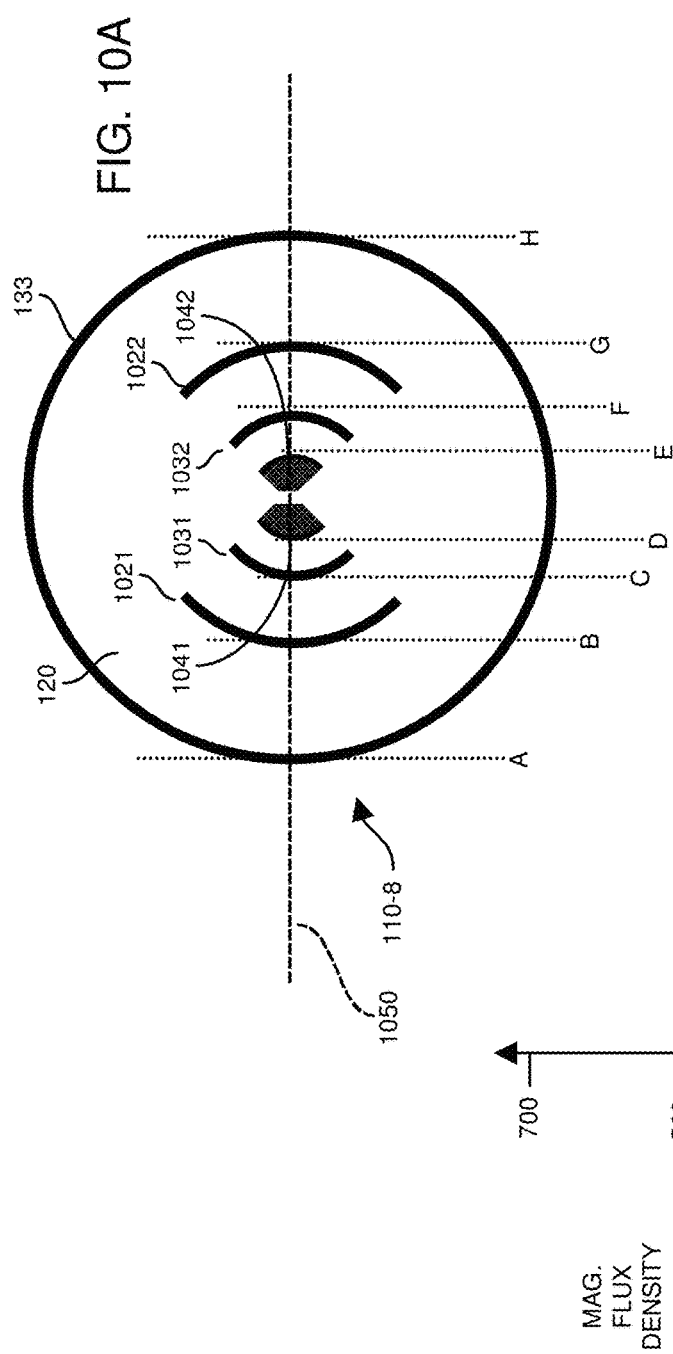
FIG. 10A is an example diagram illustrating arc-shaped conductive paths (inductive paths) disposed in an inductor device according to embodiments herein.

FIG. 10A is an example diagram illustrating arc-shaped conductive paths (inductive paths) disposed in an inductor device according to embodiments herein.

The inductor device 110-7 in FIG. 9A can be further improved by reducing the peak flux further and lowering the coupling factor as shown in FIG. 10A. This is achieved by cutting into the split rings (arc-shaped electrically conductive paths 1021, 1022, 1031, and 1032). Via inductor device 110-8, the peak flux is further reduced to below 340 mT, while keeping to the similar per-phase inductance value at 32 nH (as previously discussed with respect to the inductor device 110-7), the inter-phase coupling coefficient of inductor device 110-8 is also reduced to 0.57.

Thus, in this example embodiment, the fabricator 140 fabricates the inductor device 110-8 to include a first set of electrically conductive paths 1021 and 1022 which are disposed in the inductor device 110-8 to form a first discontinuous ring (split ring); each of the electrically conductive paths 1021 and 1022 in the first set extend from the first end 141 of the inductor device 110-8 to the second end 142 of the inductor device 110-8.

Additionally, the fabricator 140 fabricates the inductor device 110-8 to include a second set of electrically conductive paths 1031 and 1032 which are disposed in the inductor device 110-8 to form a second discontinuous ring (split ring) concentric with the first ring (electrically conductive paths 1021 and 1022); each of the electrically conductive paths 1031 and 1032 in the second set extend from the first axial end (141) of the inductor device 110-8 to the second axial end (142) of the inductor device 110-8.

In one embodiment, the first discontinuous ring of electrically conductive paths 1021 and 1022 is concentric with respect to the second discontinuous ring of electrically conductive paths 1031 and 1032.

The fabricator 140 further fabricates the inductor device 110-8 to include electrically conductive paths 1041 and 1042. Each of the electrically conductive paths 1041 and 1042 extends from the first end 141 of the inductor device 110-8 to the second end 142 of the inductor device 110-8.

Figure 10B:
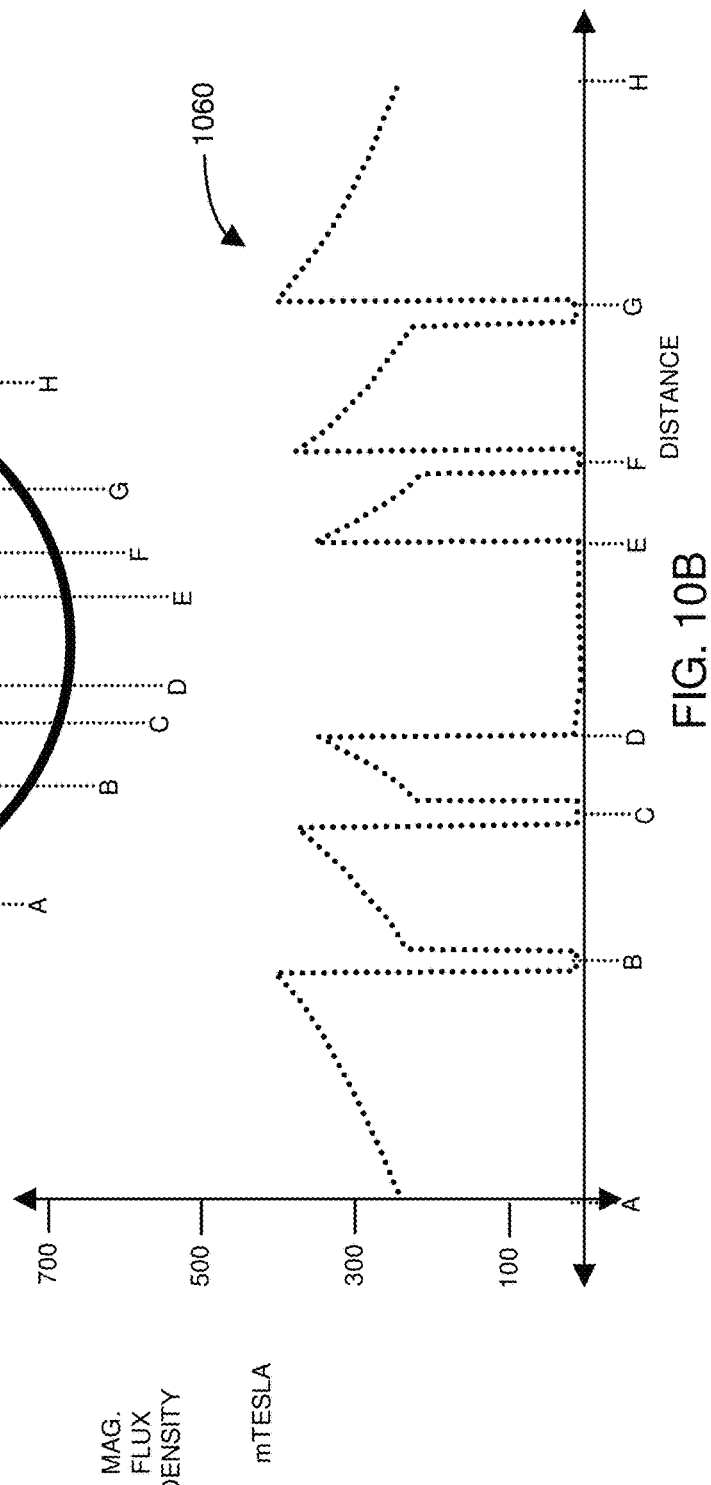
FIG. 10B is an example diagram illustrating density of magnetic flux in the inductor device of FIG. 10A according to embodiments herein.

FIG. 10B is an example diagram illustrating density of magnetic flux in the inductor device of FIG. 10A according to embodiments herein.

As shown in graph 1060, the magnitude of the magnetic flux density varies along the cross section 1050 of the inductor device 110-8.

Figure 11:
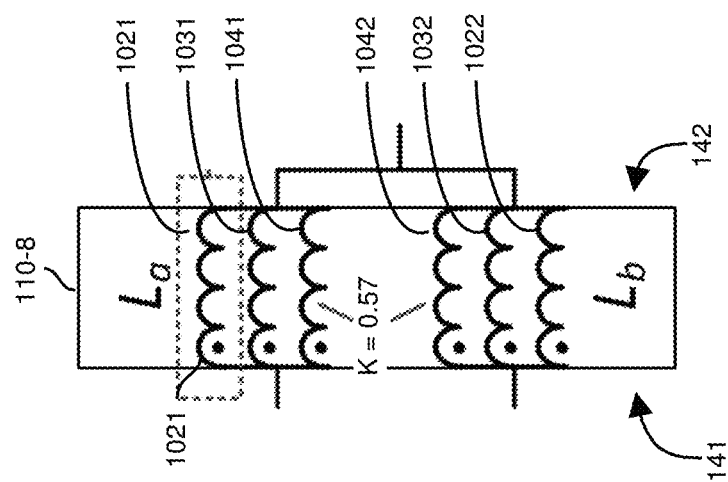
FIG. 11 is an example diagram illustrating connectivity of multiple conductive paths and corresponding magnetic coupling according to embodiments herein.

FIG. 11 is an example diagram illustrating logical and/or physical connectivity of multiple conductive paths and corresponding magnetic coupling according to embodiments herein.

In this example embodiment, based on the implementation of inductor device 110-8, each of the electrically conductive paths 1021, 1031, and 1041 is connected in parallel to create a single equivalent inductor, La. Each of the electrically conductive paths 1022, 1032, and 1042 is connected in parallel to create a single equivalent inductor Lb. The output end (second end 142) associated with inductor La and inductor Lb are electrically connected.

Connectivity of one or more electrically conductive paths can be achieved in any suitable manner. For example, ends of electrically conductive paths in the inductor device 110 can be fabricated from wire, traces, sheet of metal, etc.

Figure 12:
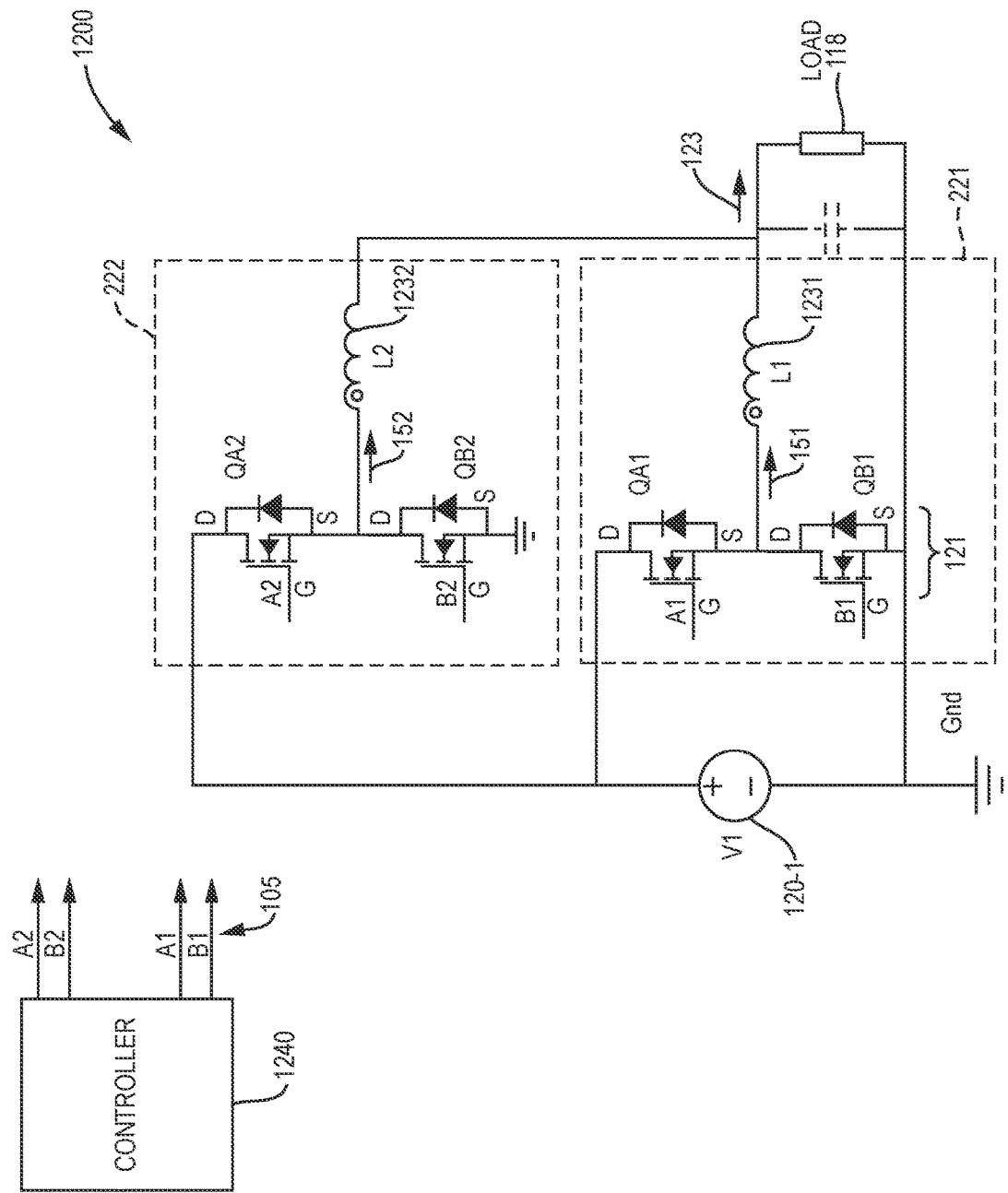
FIG. 12 is an example diagram illustrating connectivity of circuit components in a power supply according to embodiments herein.

FIG. 12 is an example diagram illustrating connectivity of circuit components in a power supply according to embodiments herein.

In this non-limiting example embodiment, the power supply 1200 includes controller 1240 and multiple phases 221 and 222 that collectively generate a respective output voltage 123 (output current) to power load 118. The load 118 can be any suitable circuit such as CPUs (Central Processing Units), GPUs and ASICs (such those including one or more Artificial Intelligence Accelerators), etc., which can be located on standalone circuit board.

Note that power supply 1200 can include any number of phases. If desired, the phases can be split such that the first phase 221 powers a first load independent of the second phase powering a second load.

As shown in the example embodiment of operating a combination of the phase 221 and phase 222 to power the same load 118, phase 221 includes switch QA1, switch QB1, and inductive path 1231. Phase 222 includes switch QA2, switch QB2, and inductive path 1232.

Further in this example embodiment, the voltage source 120-1 supplies voltage V1 (such as 6 VDC or any suitable voltage) to the series combination of switch QA1 (such as a high-side switch) and switch QB1 (such as a low-side switch).

In one embodiment, the combination of switch QA1 and QB1 as well as inductive path 1231 (electrically conductive path) operate in accordance with a buck converter topology to produce the output voltage 123.

Further in this example embodiment, note that the drain node (D) of switch QA1 is connected to receive voltage V1 provided by voltage source 120-1. The source node (S) of switch QA1 is coupled to the drain node (D) of switch QB1 as well as the input node of inductive path 1231. The source node of switch QB1 is coupled to ground. The output node of the inductive path 1231 is coupled to the load 118.

Yet further in this example embodiment, the drain node of switch QA2 of phase 222 is connected to receive voltage V1 provided by voltage source 120-1. The source node (S) of switch QA2 is coupled to the drain node (D) of switch QB2 as well as the input node of inductive path 1232. The source node of switch QB2 is coupled to ground. The output node of the inductive path 1232 is coupled to the load 118.

As previously discussed, the combination of the phases 221 and 222 produces the output voltage 123 that powers load 118. That is, the inductive path 1231 produces output voltage 123; inductive path 1232 produces output voltage 123.

During operation, as shown, controller 1240 produces control signals 105 (such as control signal A1 and control signal B1) to control states of respective switches QA1 and QB1. For example, the control signal A1 produced by the controller 1240 drives and controls the gate node of switch QA1; the control signal B1 produced by the controller 1240 drives and controls the gate node of switch QB1.

Additionally, controller 1240 produces control signals A2 and B2 to control states of switches QA2 and QB2. For example, the control signal A2 produced by the controller 1240 drives and controls the gate node of switch QA2; the control signal B2 produced by the controller 1240 drives and controls the gate node of switch QB2.

In one embodiment, the controller 1240 controls the phases 221 and 222 to be 180 degrees out of phase with respect to each other.

As is known with buck converters, in phase 221, activation of the high-side switch QA1 to an ON state while switch QB1 is deactivated (OFF) couples the input voltage V1 to the input of the inductive path 1231, causing an increase in amount of current provided by the inductive path 1231 to the load 118. Conversely, activation of the low-side switch QB1 to an ON state while switch QA1 is deactivated (OFF) couples the ground reference voltage to the input of the inductive path 1231, causing a decrease in amount of current provided by the inductive path 1231 to the load 118. The controller 1240 monitors a magnitude of the output voltage 123 and controls switches QA1 and QB1 such that the output voltage 123 stays within a desired voltage range.

In phase 222, in a similar manner, activation of the high-side switch QA2 to an ON state while switch QB2 is deactivated (OFF) couples the input voltage V1 to the input of the inductive path 1232 causing an increase in amount of current provided by the inductive path 1232 to the load 118. Conversely, activation of the low-side switch QB2 to an ON state while switch QA2 is deactivated (OFF) couples the ground reference voltage to the input of the inductive path 1232, causing a decrease in amount of current provided by the inductive path 1232 to the load 118. The controller 1240 monitors a magnitude of the output voltage 123 and controls switches QA2 and QB2 such that the output voltage 123 stays within a desired voltage range.

Figure 13:
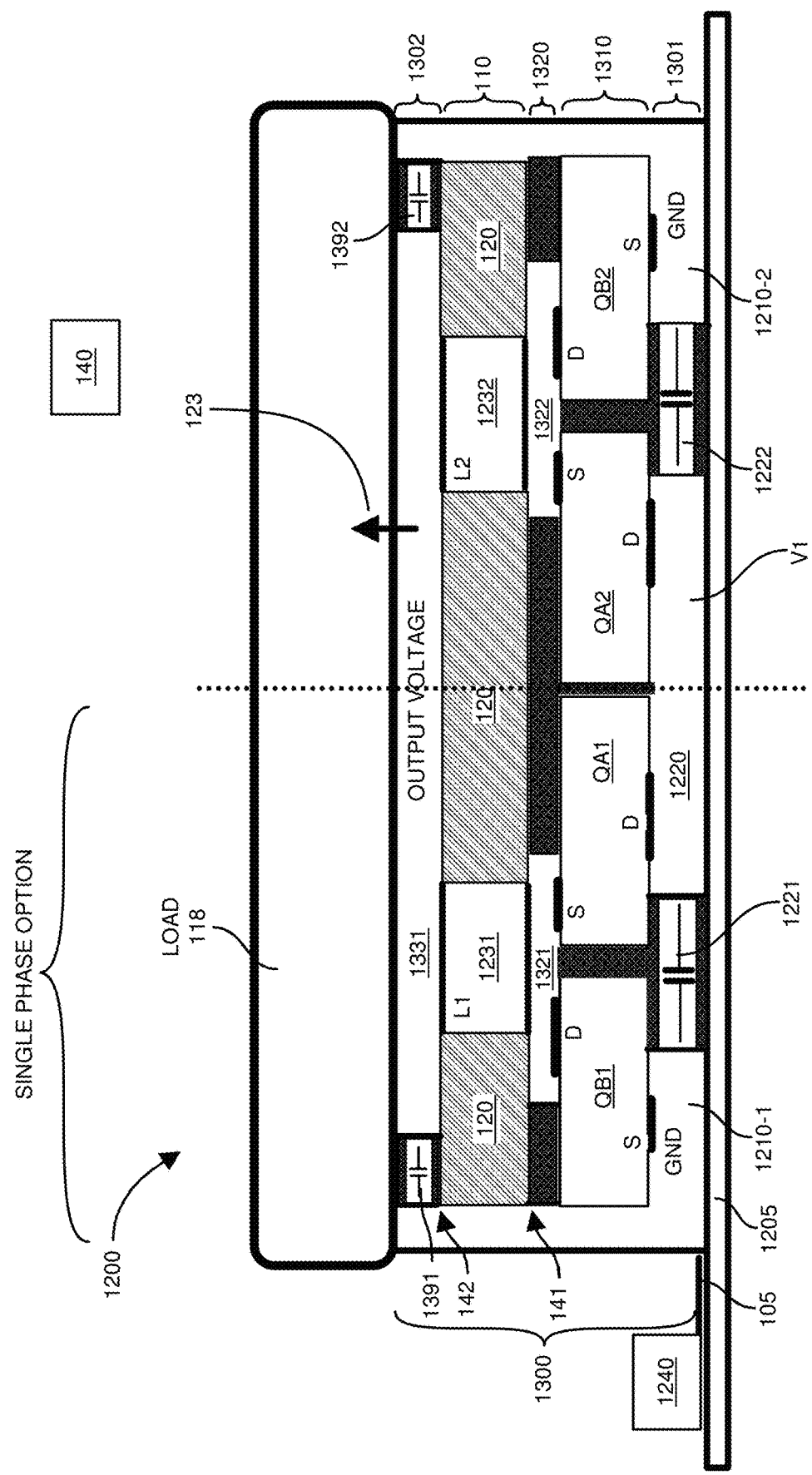
FIG. 13 is an example side view diagram illustrating a multi-phase power supply (in FIG. 12) supporting vertical power flow according to embodiments herein.

FIG. 13 is an example side view diagram illustrating the multi-phase power supply of FIG. 12 instantiated in a vertical stack according to embodiments herein.

The power supply 1200 in this example embodiment supports vertical power flow. For example, the substrate 1205 and corresponding one or more power sources such as V1 supply power to the power supply stack assembly 1300, which in turn powers the dynamic load 118. Ground reference (GND) conveyed through the power supply stack assembly 1300 provides a reference voltage and return path for current conveyed through the stack to the load 118.

In one embodiment, the substrate 1205 is a circuit board (such as a standalone board, mother board, standalone board destined to be coupled to a mother board, etc.). The power supply stack assembly 1300 including one or more inductor devices is coupled to the substrate 1205. As previously discussed, the load 118 can be any suitable circuit such as CPUs (Central Processing Units), GPUs and ASICs (such those including one or more Artificial Intelligence Accelerators), which can be located on standalone circuit board.

Note that the inductor device 110 in the power supply stack assembly 1300 can be instantiated in any suitable manner as described herein. In this non-limiting example embodiment, the power supply stack assembly 1300 includes the inductor device 110 in FIG. 1A. Power supply stack assembly 1300 can be configured to include any of the inductor devices 110 as described herein.

Further in this example embodiment, the fabricator 140 fabricates power supply stack assembly 1300 (such as a DC-DC power converter) via stacking of multiple components including a first power interface 1301, one or more switches in switch layer 1310, connectivity layer 1320, one or more inductor assemblies (such as including inductor device 110), and a second power interface 1302.

The fabricator 140 further disposes the first power interface 1301 at a base of the stack (power supply assembly 1300 of components). The base of power supply stack assembly 1300 (such as power interface 1301) couples the power supply stack assembly 1300 to the substrate 1205.

In one embodiment, fabricator 140 disposes capacitors 1221 and 1222 in a layer of the power supply stack assembly 1300 including the power interface 1301.

Yet further, when fabricating the power supply stack assembly 1300, the fabricator 140 electrically couples multiple switches such as switch QA1, QB1, QA2, and QB2 in the power supply stack assembly 1300 to the first power interface 1301. The first power interface 1301 and corresponding connectivity to the substrate 1205 enables the switches QA1, QB1, QA2, and QB2 to receive power such as power input such as input voltage V1 and GND reference voltage from the substrate 1205. One or more traces, power layers, etc., on substrate 1205 provides or conveys the voltages from voltage (or power) sources to the power interface 1301 of the power supply stack assembly 1300.

As previously discussed, controller 1240 generates control signals 105 to control respective switches QA1, QB1, QA2, and QB2 in the power supply stack assembly 1300. Fabricator 140 provides connectivity between the controller 1240 and the switches QA1, QB1, QA2, and QB2 in any suitable manner to convey respective signals 105.

Atop the switches in the switch layer 1310, the fabricator 140 further fabricates the power supply stack assembly 1300 to include one or more inductor devices as described herein. Additionally, via connectivity layer 1320, the fabricator 140 further connects the switches QA1, QB1, QA2, and QB2 to the one or more inductor devices 110.

More specifically, in this example embodiment, the fabricator 140 connects the source node (S) of switch QB1 to the ground reference node 1210-1 in the power interface 1301. Note that the ground reference node 1210-1 extends from the substrate 1205 to the dynamic load 118 via L-shaped ground node 1210-1 (which is connected to the ground voltage reference). The fabricator 140 connects the drain node (D) of switch QB1 to node 1321 (such as fabricated from metal), which is electrically connected to the first end 141 of the inductive path 1231 (such as instantiation of electrically conductive path 131). Thus, via connectivity layer 1320, the fabricator connects the drain node of the switch QB1 to the inductive path 1231 of inductor device 110.

The fabricator 140 connects the drain node (D) of switch QA1 to the voltage source node 1220 (which is electrically connected to the input voltage V1) of the first power interface 1301. The fabricator 140 connects the source node (S) of switch QA1 to node 1321, which is electrically connected to the first end 141 of the inductive path 1231 (instantiation of electrically conductive path 131) as previously discussed. Thus, via connectivity layer 1320 and corresponding node 1321, the source node of the switch QA1 is connected to the inductive path 1231 of inductor device 110.

As further shown, the fabricator 140 connects the source node (S) of switch QB2 to the ground reference node 1210-2 in the power interface 1301. The ground reference node 1210-2 extends from the substrate 1205 to the dynamic load 118 via L-shaped ground reference node 1210-2 (which is connected to the ground voltage reference). The fabricator 140 connects the drain node (D) of switch QB2 to node 1322 (such as fabricated from metal), which is electrically connected to the first end 141 of the inductive path 1232 (such as instantiation of electrically conductive path 132). Thus, via connectivity layer 1320, the drain node of the switch QB2 is connected to the inductive path 1232 of inductor device 110.

Note that although each of the nodes 1210-1 and 1210-2 appear to be L-shaped from a side view of the power supply stack assembly 1300, in one embodiment, the node 1210 extends circumferentially about an outer surface of the power supply stack assembly 1300 (in a similar manner as electrically conductive path 133 as previously discussed).

As further shown, the fabricator 140 connects the drain node (D) of switch QA2 to the voltage source node 1220 (which is connected to voltage V1) in the power interface 1301. The fabricator 140 connects the source node (S) of switch QA2 to node 1322, which is electrically connected to the first axial end 141 of the inductive path 1232 (instantiation of electrically conductive path 132). Thus, via connectivity layer 1320 and corresponding node 1322, the source node of the switch QA2 is connected to the inductive path 1232 of inductor device 110.

Accordingly, the fabricator 140 disposes the one or more switches (such as QA1, QB1, QA2, and QB2) in the power supply stack assembly 1300 between the first power interface 1301 and the inductor device 110.

In one non-limiting example embodiment, each of the one or more switches QA1, QB1, QA2, and QB2 in the power supply stack assembly 1300 is a vertical field effect transistor disposed between the first power interface 1301 and the inductor device 110. However, additionally, or alternatively, note that one or more of switches QA1, QB1, QA2, and QB2 can be any suitable type of switches such as vertical or lateral field effect transistors, bipolar junction transistors, etc. It is also possible for lateral FETs, but vertical FETs are the ideal choice for this concept due to the flip chip method to minimize the current loop.

As previously discussed, the fabricator 140 fabricates the power supply stack assembly 1300 to include one or more inductor devices 110. In this example embodiment, the fabricator disposes the multiple inductive paths 1231 in the power supply stack assembly 1300 between the multiple switches QA1, QB1, QA2, and QB2 and the second power interface 1302.

In accordance with further embodiments, note that fabrication of the multiple inductive paths 1231 and 1232 includes: fabricating the multiple inductive paths to include a first inductive path 1231 and a second inductive path 1232 extending through core material 120 of the inductor device 110 between the connectivity layer 1320 and the power interface 1302. In one embodiment, fabricator 140 fabricates the inductor device 110 to include: i) core material 120, the core material being magnetically permeable ferromagnetic material, ii) a first inductive path 1231 extending through the core material 120 from a first axial end 141 of the inductor device 110 to a second axial end 142 of the inductor device 110, iii) a second inductive path 1232 extending through the core material 120 from a first axial end 141 of the inductor device 110 to a second axial end 142 of the inductor device 110.

Yet further in this example embodiment, the first inductive path 1231 is disposed in a first phase 221 (FIG. 12) of the power supply stack assembly 1300 (power converter circuit); the second inductive path 1232 is disposed in a second phase 222 (FIG. 12) of the power supply stack assembly 1300 (power converter circuit). During operation of the power converter (power supply stack assembly 1300), a combination of the first phase 221 and the second phase 222 disposed in parallel produce the output voltage 123. If desired, the controller 1240 can be fabricated into the power supply stack assembly 1300 as well.

In one embodiment, each of the one or more inductive paths 1231 and 1232 is a respective non-winding path extending from a first layer (such as switch layer 1310) in the stack including the multiple switches QA1, QB1, QA2, and QB2 to a second layer in the stack including the second power interface 1302.

Note that further embodiments herein include connecting multiple inductive paths in the inductor device 110 in parallel to decrease an inductance of a respective inductive path. As described herein, any number of inductive paths in the inductor device 110 can be connected in parallel to provide a desired overall inductance. Thus, in addition to controlling parameters such as permeability of the core material 120, a respective length (between first end 141 and second end 142) of each non-winding electrically conductive path (such as straight or direct path) in the inductor device 110, embodiments herein also include connecting multiple inductive paths in parallel to control a magnitude of inductance provided by the respective inductor device 110.

As further shown, the fabricator 140 disposes the inductor device 110 in the power supply stack assembly 1200 between the multiple switches (QA1, QB1, QA2, and QB2) in switch layer 1310 and the second power interface 1302.

More specifically, the fabricator 140 produces the power supply assembly 1300 to include a second power interface 1302. In one embodiment, the fabricator 140 connects the output axial end of the inductor device 110 and corresponding nodes to the second power interface 1302. The second power interface 1302 is operable to receive the output voltage 123 produced by the inductor device 110 and output it to the load 118. The fabricator 140 couples the output nodes of both the inductive path 1231 and inductive path 1232 to the output voltage node 1331 (such as a layer of material such as metal). Thus, the output voltage node 1331 is electrically connected to the output of the respective inductive paths 1231 and 1232.

In one embodiment, one or more nodes or pins, pads, etc., of the dynamic load 118 are coupled to the output voltage node 1331. For example, output voltage node 1331 of the power supply stack assembly 1200 conveys the output voltage 123 produced by each of the inductive paths 1231 and 1232 to the one or more nodes, pins, pads, etc., of the load 118.

Accordingly, via switching of the inductive paths between the ground voltage and the input voltage V1, the combination of inductive paths 1231 and 1232 collectively produces the output voltage 123 to power the load 118.

As previously discussed, power supply stack assembly 1300 further includes ground node 1210-1 and 1210-2 (such as an instantiation of third electrically conductive path 133). In one embodiment, the instantiation of electrically conductive path 133 (such as ground nodes 1210-1, 1210-2, etc.,) of the inductor device 110 provide perimeter electromagnetic shielding with respect to power supply stack assembly 1300, preventing or reducing corresponding radiated emissions into the surrounding environment.

In yet further embodiments, the fabricator 140 fabricates the first power interface 1301 to include first contact elements operable to connect the first power interface 1301 at the base of the power supply stack assembly 1300 to a host substrate 1205. The fabricator fabricates the second power interface 1302 to include second contact elements operable to affix a dynamic load 118 to the power supply stack assembly 1300.

Note that power supply stack assembly 1200 is fabricated to further include first capacitors 1221, 1222, etc., providing connectivity between the input voltage node 1220 (first electrically conductive path supplying input voltage V1 to the power supply stack assembly 1300) and ground nodes 1210-1 and 1210-2 (such as second electrically conductive path supplying the ground reference voltage to the power supply stack assembly 1300).

The fabricator 140 further disposes output voltage node 1331 (such as another electrically conductive path) in the layer of the power supply stack assembly 1302 including the second power interface 1302. As previously discussed, the output voltage node 1331 (such as layer of metal) is operable to convey the output voltage 123 to the dynamic load 118.

In accordance with further embodiments, the fabricator 140 fabricates the power supply stack assembly 1300 to include second capacitors (1391, 1392, etc.) connected between the output voltage node 1331 and a respective ground node 1210. More specifically, capacitor 1391 is coupled between output voltage node 1331 and the ground node 1210-1; capacitor 1392 is coupled between output voltage node 1331 and the ground node 1210-2.

As previously discussed, node 1210 can be a continuous perimeter shield surrounding the inductor device 110 and/or power supply stack assembly 1300.

Further embodiments herein include affixing a dynamic load 118 to the second power interface 1302. Accordingly, the dynamic load 118 is affixed atop the power supply stack assembly 1300.

The power supply stack assembly 1300 (assembly of components such as a vertical stack) as described herein provides advantages over conventional power converters. For example, the power supply stack assembly 1300 as described herein provides novel connectivity of components in an assembly (such as via stacking), resulting in shorter circuit paths and lower losses when converting and delivering power to the dynamic load 118.

As previously discussed with respect to FIG. 12, during operation, the inductor device 110 and corresponding inductive paths 1231 and 1232 are operable to produce an output voltage 123 based on the received power (current supplied by input voltage, V1). In other words, the power supply stack assembly 1300 and corresponding fabricated stack of components (such as first power interface 1301, one or more switches QA1, QB1, QA2, and QB2, inductor device 110, second power interface 1302) is a power converter operable to convert an input voltage V1 (such as a DC voltage) received at the first power interface 1301 into the output voltage 123 (such as a DC voltage) outputted from the second power interface 1302 to the dynamic load 118.

Further embodiments herein include fabrication of the system. For example, embodiments herein include a fabricator 140. The fabricator 140 receives a substrate 1205 such as a circuit board; the fabricator 140 affixes a base (such as interface 1301) of the stack of components (such as a power supply stack assembly 1300) to the circuit board. As previously discussed, the stack of components (power supply stack assembly 1300) is operative to generate an output voltage 123 to power a load 118. The load 118 is either affixed to the circuit board or the load 118 is affixed atop the power supply stack assembly 1300.

Further, as previously discussed, the load 118 can be any suitable circuit such as CPUs (Central Processing Units), GPUs and ASICs (such those including one or more Artificial Intelligence Accelerators), which can be located on standalone circuit board.

Figure 14:
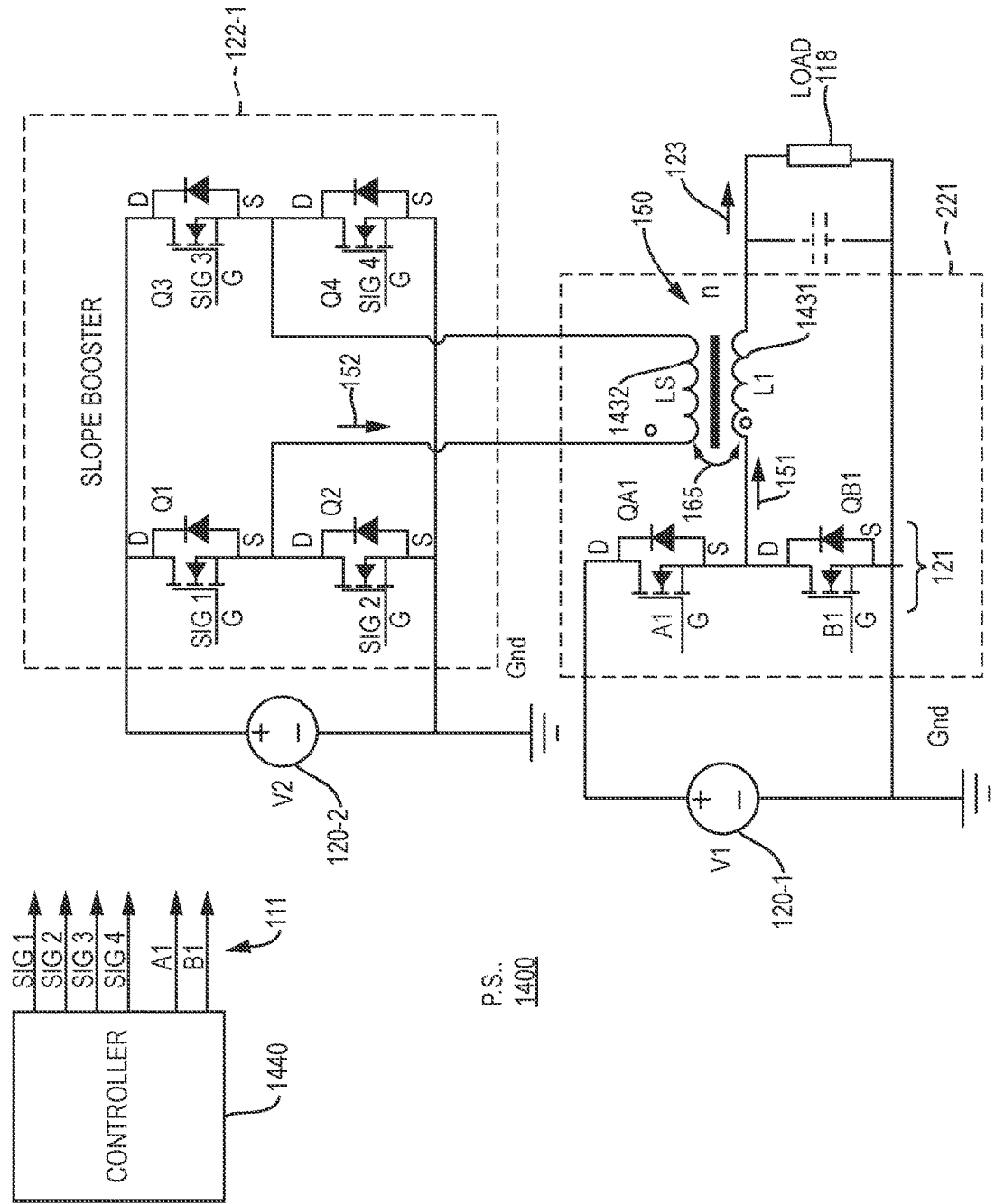
FIG. 14 is an example diagram illustrating connectivity of circuit components in a power supply according to embodiments herein.

FIG. 14 is an example diagram illustrating connectivity of circuit components in a power supply according to embodiments herein.

In this example embodiment, the switching power supply phase 221 includes switch QA1, switch QB1, and inductive path 151. The voltage source 120-1 supplies voltage V1 (such as 6 VDC or any suitable voltage) to the series combination of switch QA1 (such as a high-side switch) and switch QB1 (such as a low-side switch).

In one embodiment, the combination of switch QA1 and QB1 as well as inductive path 1431 (electrically conductive path) is a buck converter.

As further shown in this example embodiment, the drain node of switch QA1 is connected to receive voltage V1 provided by voltage source 120-1. The source node (S) of switch QA1 is coupled to the drain node (D) of switch QB1 as well as the input node of inductive path 1431. The source node (S) of switch QB1 is coupled to ground. The output node of the inductive path is coupled to the load 118.

During operation, controller 1440 produces control signals 111 (such as control signal A1 and control signal B1) to control states of switches QA1 and QB1. For example, the control signal A1 produced by the controller 1440 drives and controls the gate node (G) of switch QA1; the control signal B1 produced by the controller 140 drives and controls the gate node (G) of switch QB1.

Further in this example embodiment, the slope booster 122-1 (circuit) includes switches Q1, Q2, Q3, and Q4 such as configured as a full bridge circuit.

The voltage source 120-2 supplies voltage V2 (such as 12 VDC or any suitable voltage) to the full bridge arrangement of switches Q1, Q2, Q3, and Q4. The first series combination of switch Q1 and switch Q2 is disposed in parallel with the second series combination of switch Q3 and switch Q4.

The drain node (D) of switch Q1 is connected to receive voltage V2 provided by voltage source 120-2. The source node (S) of switch Q1 is coupled to the drain node (D) of switch Q2 as well as the input node of inductor device (such as electrically conductive path 1432) (Ls). The source node (S) of switch Q2 is coupled to ground.

As further shown, the drain node (D) of switch Q3 is connected to receive voltage V2 provided by the voltage source 120-2. The source node (S) of switch Q3 is coupled to the drain node (D) of switch Q4 as well as the output node of winding 152 (Ls). The source node (S) of switch Q4 is coupled to ground.

During operation, controller 1440 produces control signals 111 (such as control signal SIG1, control signal SIG2, control signal SIG3, and control signal SIG4). The control signal SIG1 controls the gate (G) of switch Q1; the control signal SIG2 controls the gate (G) of switch Q2; the control signal SIG3 controls the gate (G) of switch Q3; the control signal SIG4 controls the gate (G) of switch Q4. Logic high voltage applied to a corresponding gate turns a respective switch ON (low resistive path between the drain and source node). Logic low voltage applied to a corresponding gate turns a respective switch OFF (in which current is prevented from flowing through the respective switch).

In this example embodiment, as previously discussed, the circuit 122-1 (such as a slope booster) is a full bridge arrangement (such as bridge configuration of switches Q1, Q2, Q3, and Q4) for both positive and negative di/dt (ramp up and down) as well as modulation with respect to current through inductive path 151 as further discussed herein.

In one embodiment, when a fast change in current (positive or negative) must be provided by the inductive path 1431 to the load 118 to maintain a magnitude of the output voltage 123 within regulation, the controller 1240 can be configured to activate pairs of switches in the slope booster circuit 122-1 to provide an appropriate amount of current to the dynamic load 118.

More specifically, to provide a boost of output current to the dynamic load 118 as a supplement to an amount of current that the inductive path 1431 can provide, the controller 1440: i) activates QA1 and deactivates switch QB1; ii) activates switches Q1 and Q4 and deactivates switches Q2 and Q3. The current 152 through the inductive path 1432 generates magnetic flux (magnetic energy) that couples to inductive path 1431, increasing the respective output current supplied by the inductive path 1431 to the load 118.

Conversely, to provide a fast reduction in output current supplied to the dynamic load 118, the controller 1440: i) deactivates switch QA1 and activates switch QB1; ii) deactivates switches Q1 and Q4 and activates switches Q2 and Q3. The (negative) current 152 through the inductive path 1432 causes generation of magnetic flux (magnetic energy)

that couples to inductive path 1431, decreasing the respective output current supplied to the load 118 from the inductive path 1431. In other words, the controller 1440 controls the switches in the slope booster 122-1 to reduce output current from the inductive path 1431 to the load 118.

Figure 15:
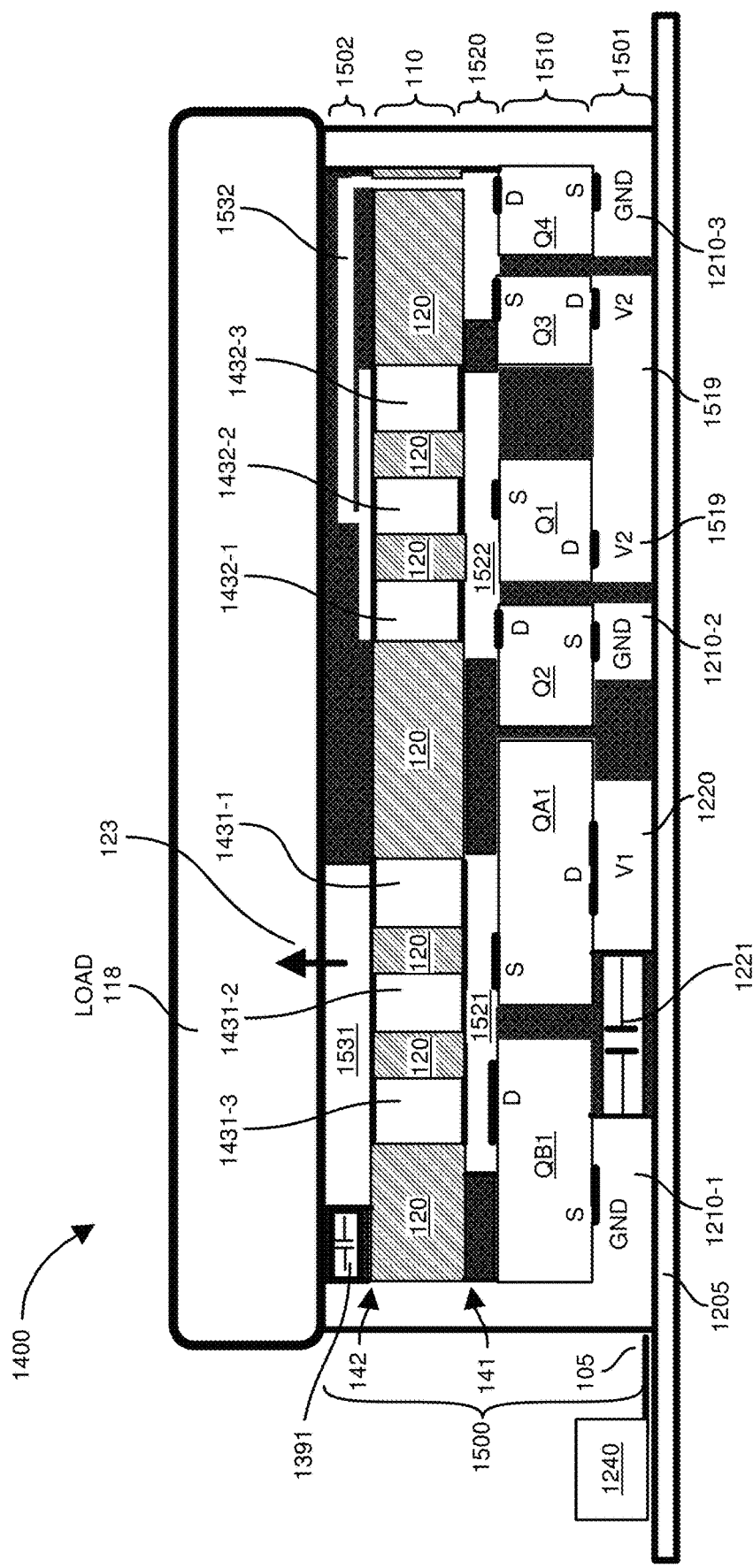
FIG. 15 is an example side view diagram illustrating the power supply in FIG. 14 supporting vertical power flow according to embodiments herein.

Note further that embodiments herein include fabrication of power supply 1400 as a power supply stack assembly (as shown in FIG. 15) to include multiple inductive paths including a first inductive path 1431 and a second inductive path 1432: the first inductive path 1431 is disposed in a phase of the power converter, the second inductive path 1432 is magnetically coupled to the first inductive path 1431 to apply magnetic energy adjustments (providing voltage/current output boost and reduction capability) to the first inductive path 1431. In such an instance, a combination of the phase 221 and input (such as magnetic energy adjustments, positive or negative) from the second inductive path 1432 is operable to produce and maintain regulation of the output voltage 123 within a desired range.

FIG. 15 is an example side view diagram illustrating the power supply in FIG. 14 supporting vertical power flow according to embodiments herein.

The power supply stack assembly 1500 (associated with power supply 1400) in this example embodiment supports vertical power flow. For example, the substrate 1205 and corresponding one or more power sources such as V1 (voltage source 120-1) and V2 (voltage source 120-2) supply power to the power supply stack assembly 1500, which in turn powers the dynamic load 118.

Ground reference (GND) conveyed or coupled through the power supply stack assembly 1500 provides a reference voltage and return path for current conveyed through the power supply stack assembly 1500 to the load 118.

Note that the inductor device 110 in the power supply stack assembly 1500 can be instantiated in any suitable manner as described herein. In this non-limiting example embodiment, the power supply stack assembly 1500 includes the inductor device 110-8 in FIG. 10A.

Further in this example embodiment, the fabricator 140 fabricates power supply stack assembly 1500 (such as a DC-DC power converter) via stacking of multiple components including a first power interface 1501, one or more switches in switch layer 1510, connectivity layer 1520, one or more inductor assemblies (such as including inductor device 110-8), and a second power interface 1502.

The fabricator 140 further disposes the first power interface 1501 at a base of the stack (power supply stack assembly 1500 of components). The base (such as power interface 1501) of power supply stack assembly 1500 couples the power supply stack assembly 1500 to the substrate 1205.

In one embodiment, fabricator 140 disposes capacitor 1221 in a layer of the power supply stack assembly 1500 including the power interface 1501. Capacitor 1221 is disposed between voltage V1 (1220) and ground reference 1210-1.

Yet further, when fabricating the power supply stack assembly 1500, the fabricator 140 electrically couples multiple switches such as switch QA1, QB1, Q1, Q2, Q3, and Q4 in the power supply stack assembly 1500 to the first power interface 1501.

The first power interface 1501 and corresponding connectivity to the substrate 1205 enables the switches QA1, QB1, Q1, Q2, Q3, and Q4 to receive power such as via input voltages V1, V2, and GND reference voltage from the substrate 1205. One or more traces, power layers, etc., on substrate 1205 provides or conveys the voltages from voltage (or power) sources to the power interface 1501 of the power supply stack assembly 1500.

As previously discussed, controller 1240 generates control signals 105 to control respective switches QA1, QB1, Q1, Q2, Q3, and Q4 in the power supply stack assembly 1500. Fabricator 140 provides connectivity between the controller 1240 and the switches QA1, QB1, Q1, Q2, Q3, and Q4 in any suitable manner to convey respective signals 105.

As further shown, atop the switches QA1, QB1, Q1, Q2, Q3, and Q4 in switch layer 1510, the fabricator 140 further fabricates the power supply stack assembly 1500 to include one or more inductor devices (such as any instantiation of inductor device 110) as described herein. Additionally, via connectivity layer 1520, the fabricator 140 further connects the switches QA1, QB1, Q1, Q2, Q3, and Q4 to the one or more inductor devices 110.

More specifically, in this example embodiment, the fabricator 140 connects the source node (S) of switch QB1 to the ground reference node 1210-1 in the power interface 1501.

Note that the ground reference node 1210-1 extends from the substrate 1205 to the dynamic load 118 via L-shaped (from side view) ground node 1210-1 (which is connected to the ground voltage reference). The fabricator 140 connects the drain node (D) of switch QB1 to node 1521 (such as fabricated from metal), which is electrically connected to the first end 141 of the inductive paths 1431-3, 1431-2, and 1431-3 (which collectively, via a parallel connection represent inductive path 1431 in FIG. 14).

Thus, via connectivity layer 1520 and corresponding node 1521, the fabricator 140 connects the drain node of the switch QB1 to the inductive path 1431 (parallel connection of inductive path 1431-1, 1431-2, and 1431-3) of inductor device 110-8.

The fabricator 140 additionally connects the drain node (D) of switch QA1 to the voltage source node 1220 (which is electrically connected to the input voltage V1) of the first power interface 1501. The fabricator 140 connects the source node (S) of switch QA1 to node 1521, which is electrically connected to the first axial end 141 of the inductive path 1431 (parallel combination of inductive paths 1431-3, 1431-2, and 1431-3) as previously discussed.

Thus, via connectivity layer 1520 and corresponding node 1521, the source node of the switch QA1 is also connected to the inductive path 1431 of inductor device 110.

As further shown, the fabricator 140 connects the drain node (D) of switch Q1 to node 1519 (such as fabricated from metal), which is electrically connected to voltage source V2. Fabricator 140 connects the source node (S) of switch Q1 to the node 1522 (metal or electrically conductive path) in the connectivity layer 1520.

The fabricator 140 connects the source node (S) of switch Q2 to node 1210-2 (such as fabricated from metal), which is electrically connected to the ground reference voltage. Fabricator 140 connects the drain node (D) of switch Q2 to the node 1522 (metal or electrically conductive path) in the connectivity layer 1520.

Thus, via connectivity layer 1520 and corresponding node 1522, the fabricator 140 connects the source node of switch Q1 and the drain node of the switch Q2 to the inductive path 1432 (parallel connection of inductive path 1432-1, 1432-2, and 1432-3) of inductor device 110-8.

The fabricator 140 connects the drain node (D) of switch Q3 to node 1519 (such as fabricated from metal), which is electrically connected to voltage source V2. Fabricator 140 connects the source node (S) of switch Q3 to the node 1532

(metal or electrically conductive path) extending from layer 1502 to the connectivity layer 1520.

The fabricator 140 connects the source node (S) of switch Q4 to node 1210-3 (such as fabricated from metal), which is electrically connected to the ground reference voltage. Fabricator 140 connects the drain node (D) of switch Q4 to the node 1532 (metal or electrically conductive path) extending from layer 1502 to the connectivity layer 1520.

Thus, via connectivity layer 1520 and corresponding node 1532, the fabricator 140 connects the source node of switch Q3 and the drain node of the switch Q4 to the axial end 142 of the inductive path 1432 (parallel connection of inductive path 1432-1, 1432-2, and 1432-3) of inductor device 110-8.

As further shown, the ground reference node 1210-3 extends from the substrate 1205 to the dynamic load 118 via L-shaped (side view) ground reference node 1210-2 (which is connected to the ground voltage reference).

Note again that although each of the nodes 1210-1 and 1210-3 appear to be L-shaped from a side view of the power supply stack assembly 1300, in one embodiment, the node 1210 extends as a single node circumferentially about an outer surface of the power supply stack assembly 1500 (in a similar manner as electrically conductive path 133).

Accordingly, the fabricator 140 disposes the one or more switches (such as QA1, QB1, Q1, Q2, Q3, and Q4) in the power supply stack assembly 1500 between the first power interface 1301 and the inductor device 110.

In one non-limiting example embodiment, each of the one or more switches QA1, QB1, Q1, Q2, Q3, and Q4 in the power supply stack assembly 1500 is a vertical field effect transistor disposed between the first power interface 1501 and the inductor device 110-8. However, additionally, or alternatively, note that one or more of switches QA1, QB1, Q1, Q2, Q3, and Q4 can be any suitable type of switches such as horizontal field effect transistors, bipolar junction transistors, etc.

As previously discussed, the fabricator 140 fabricates the power supply stack assembly 1500 to include one or more inductor devices 110. In this example embodiment, the fabricator 140 disposes the multiple inductive paths 1431 in the power supply stack assembly 1500 between the multiple switches QA1, QB1, Q1, Q2, Q3, and Q4 and the second power interface 1502.

Yet further in this example embodiment, the first inductive path 1431 (parallel combination of 1431-1, 1431-2, and 1431-3) is disposed in a first phase 221 (FIG. 14) of the power supply stack assembly 1500 (power converter circuit); the second inductive path 1432 is disposed in a booster circuit 122-1 (FIG. 14) of the power supply stack assembly 1500 (power converter circuit). During operation of the power converter (power supply stack assembly 1500), a combination of the phase 221 and the booster circuit 222 produce the output voltage 123.

Note that, if desired, the controller 1440 can be fabricated into the power supply stack assembly 1500 as well.

In one embodiment, each of the one or more inductive paths 1431 and 1432 is a respective non-winding path extending from a first layer (such as switch layer 1510) in the power supply stack assembly 1500 including the multiple switches QA1, QB1, Q1, Q2, Q3, and Q4 to a second layer in the power supply stack assembly 1500 including the second power interface 1502.

Note that further embodiments herein include connecting multiple inductive paths 1431-1, 1431-2, and 1431-3 in the inductor device 110-8 in parallel to decrease an inductance of a respective inductive path. As described herein, any number of inductive paths in the inductor device 110 can be connected in parallel to provide a desired overall inductance.

Thus, in addition to controlling parameters such as permeability of the core material 120 associated with inductor device 110-8, a respective length (between first axial end 141 and second axial end 142) of each non-winding electrically conductive path (such as straight, axial, or direct path) in the inductor device 110, embodiments herein also include connecting multiple inductive paths in parallel to control a magnitude of inductance provided by the respective inductor device 110.

The fabricator 140 produces the power supply assembly 1500 to include a second power interface 1502. In one embodiment, the fabricator 140 connects the inductor device 110-8 and corresponding nodes to the second power interface 1502. The second power interface 1502 (and corresponding node 1531) is operable to receive the output voltage 123 produced by the inductor device 110 and output it to the load 118. Thus, the output voltage node 1531 is electrically connected to the output of the respective inductive paths 1431.

In one embodiment, one or more nodes or pins, pads, etc., of the dynamic load 118 are coupled to the output voltage node 1531. For example, output voltage node 1531 of the power supply stack assembly 1500 conveys the output voltage 123 produced by each of the inductive paths 1431 to the one or more nodes, pins, pads, etc., of the load 118.

Accordingly, via switching of the inductive path 1431 between the ground voltage and the input voltage V1, the combination of inductive paths 1431-1, 1431-2, and 1431-3 collectively produces the output voltage 123 to power the load 118 through node 1531.

In yet further embodiments, the fabricator 140 fabricates the first power interface 1501 to include first contact elements operable to connect the first power interface 1501 at the base of the power supply stack assembly 1500 to a host substrate 1205. The fabricator 140 fabricates the second power interface 1502 to include second contact elements operable to affix a dynamic load 118 to the node 1531 of the power supply stack assembly 1500.

Note that power supply stack assembly 1500 is fabricated to further include one or more capacitors 1231, providing connectivity between the output voltage 123 and the ground reference voltage.

Further embodiments herein include affixing a dynamic load 118 to the second power interface 1502. Accordingly, the dynamic load 118 is affixed atop the power supply stack assembly 1500.

The power supply stack assembly 1500 (assembly of components such as a vertical stack) as described herein provides advantages over conventional power converters. For example, the power supply stack assembly 1500 as described herein provides novel connectivity of components in an assembly (such as via stacking), resulting in shorter circuit paths and lower losses when converting and delivering power to the dynamic load 118.

Figure 21:
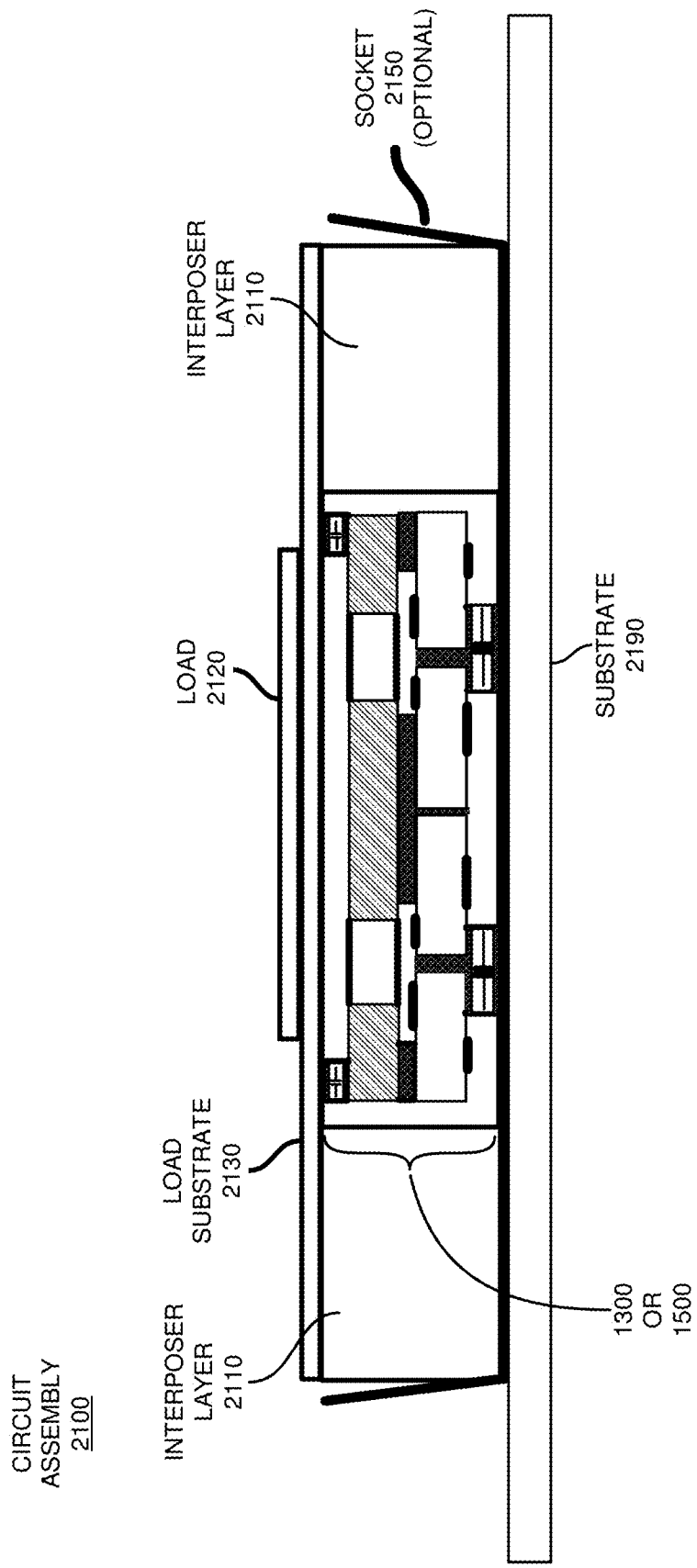
FIG. 21 is an example diagram illustrating a circuit assembly according to embodiments herein.

FIG. 21 is an example diagram illustrating a circuit assembly according to embodiments herein.

As shown in this example embodiment, circuit assembly 2100 includes power supply stack assembly 1300 or power supply stack assembly 1500 disposed in an interposer layer 2110. The interposer layer 2110 provides circuit path connectivity between the substrate 2190 and the load substrate 2130 (and load 2120).

In a manner as previously discussed, the power supply stack assembly (1300 or 1500) receives an input voltage (and any other voltage reference signals such as ground, and/or V1, V2, etc.) from the substrate 2190. The power supply stack assembly (1300 or 1500) converts the input voltage into an output voltage 123 (and/or output current) that powers the respective load 2120 and/or other circuit components disposed on the load subscribers 2130.

In one embodiment, the substrate 2190 is a Printed Circuit Board (PCB) substrate, although substrate 2190 can be any suitable component to which socket 2150 (optional) or interposer layer 2110 is connected. Via insertion into socket 2150, the interposer layer 2110 is in communication with the substrate 2190. In the absence of socket 2150, the interposer layer 2110 is connected directly to the substrate 2190.

Figure 22:
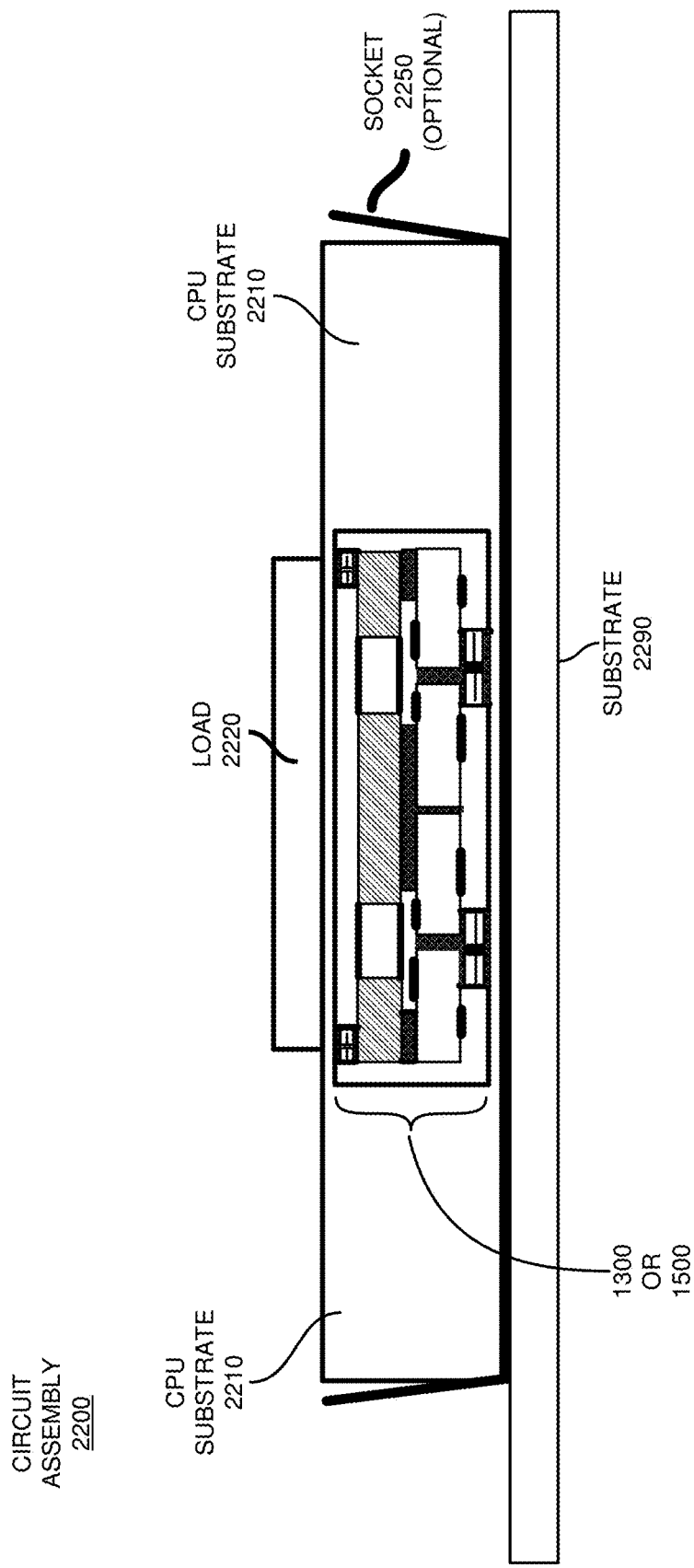
FIG. 22 is an example diagram illustrating a circuit assembly according to embodiments herein.

FIG. 22 is an example diagram illustrating a circuit assembly according to embodiments herein.

As shown in this example embodiment, circuit assembly 2200 includes power supply stack assembly 1300 or power supply stack assembly 1500 disposed in a CPU (Central Processing Unit) substrate 2210. In one embodiment, the power supply stack assembly is integrated into the laminate portion of the CPU substrate 2210 itself. The CPU substrate 2210 provides circuit path connectivity between the substrate 2290 and the load 2220 (and other components connected to the CPU substrate load 2120).

In a manner as previously discussed, the power supply stack assembly (1300 or 1500) receives an input voltage (and any other voltage reference signals such as ground, and/or voltages V1, V2, etc.) from the substrate 2290. The power supply stack assembly (1300 or 1500) converts the input voltage into an output voltage (and/or output current) that powers the respective load 2220 and/or other circuit components disposed on the load CPU substrate 2210.

In one embodiment, the substrate 2290 is a Printed Circuit Board (PCB) substrate, although substrate 2290 can be any suitable component to which socket 2250 (optional) or CPU substrate 2210 is directly connected. Via insertion into socket 2250, the CPU substrate layer 2210 and power supply stack assembly is in communication with the substrate 2290. In the absence of socket 2250, the CPU substrate 2210 is connected directly to the substrate 2290.

Figure 23:
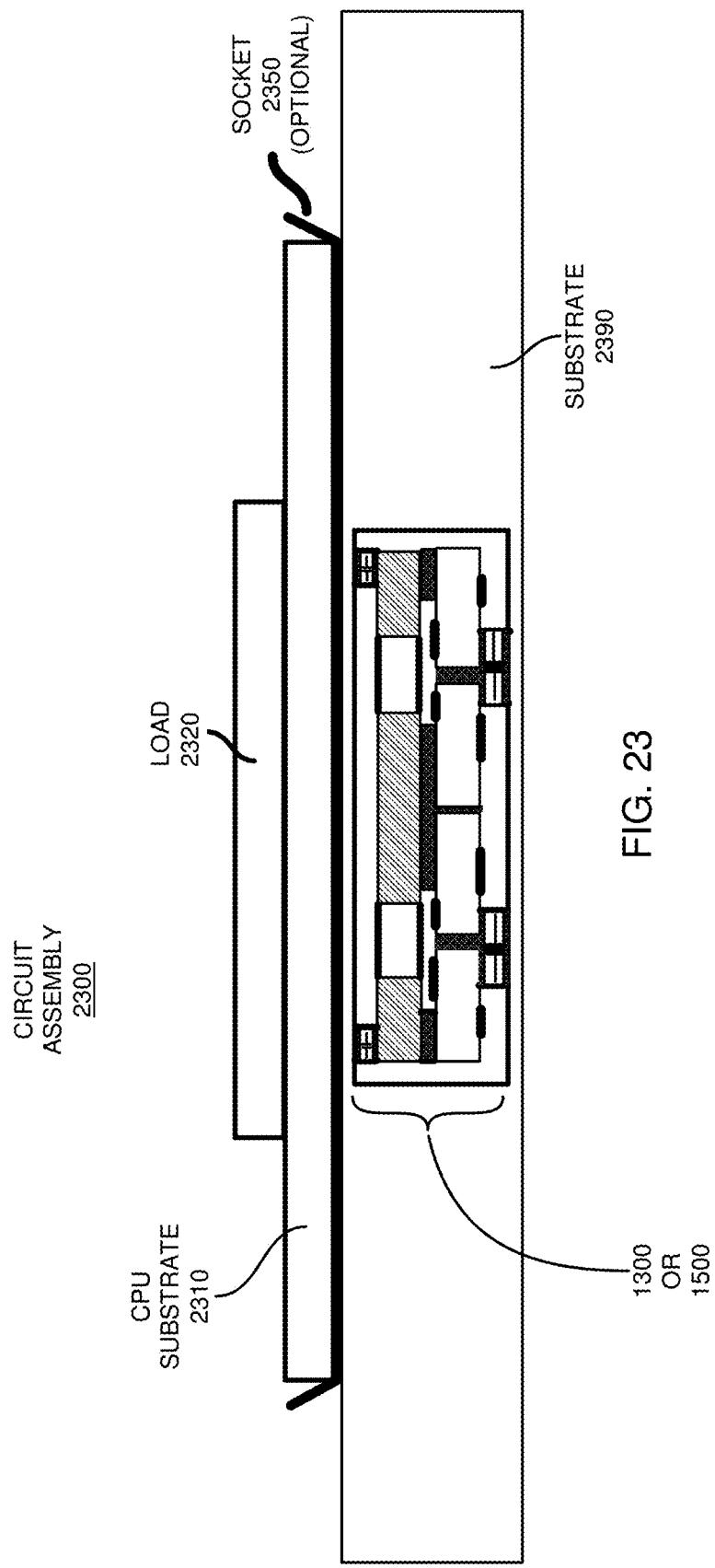
FIG. 23 is an example diagram illustrating a circuit assembly according to embodiments herein.

FIG. 23 is an example diagram illustrating a circuit assembly according to embodiments herein.

As shown in this example embodiment, circuit assembly 2300 includes power supply stack assembly 1300 or power supply stack assembly 1500 disposed in substrate 2390 such as a circuit board (such as a printed circuit board).

In one embodiment, the power supply stack assembly is embedded or fabricated in an opening of the substrate 2390. In other words, in one embodiment, the power supply stack assembly 1300 or 1500 (converter unit) is fabricated (inserted) into an opening below the CPU substrate 2310. The CPU substrate 2310 provides circuit path connectivity between the substrate 2390 and the load 2320 (and/or other components connected to the CPU substrate load 2310).

In a manner as previously discussed, the power supply stack assembly (1300 or 1500) receives an input voltage (and any other voltage reference signals such as ground, and/or V1, V2, etc.) from the substrate 2390. The power supply stack assembly (1300 or 1500) converts the input voltage into an output voltage (and/or output current) that powers the respective load 2320 and/or other circuit components disposed on the load CPU substrate 2310.

In one embodiment, the substrate 2390 is a Printed Circuit Board (PCB) substrate, although substrate 2390 can be any suitable component to which socket 2350 (optional) or CPU substrate 2310 is directly connected. In one embodiment, via insertion into socket 2350, the CPU substrate 2310 is in communication with the substrate 2390. In the absence of socket 2350, the CPU substrate 2310 is connected directly to the substrate 2390.

Figure 16:
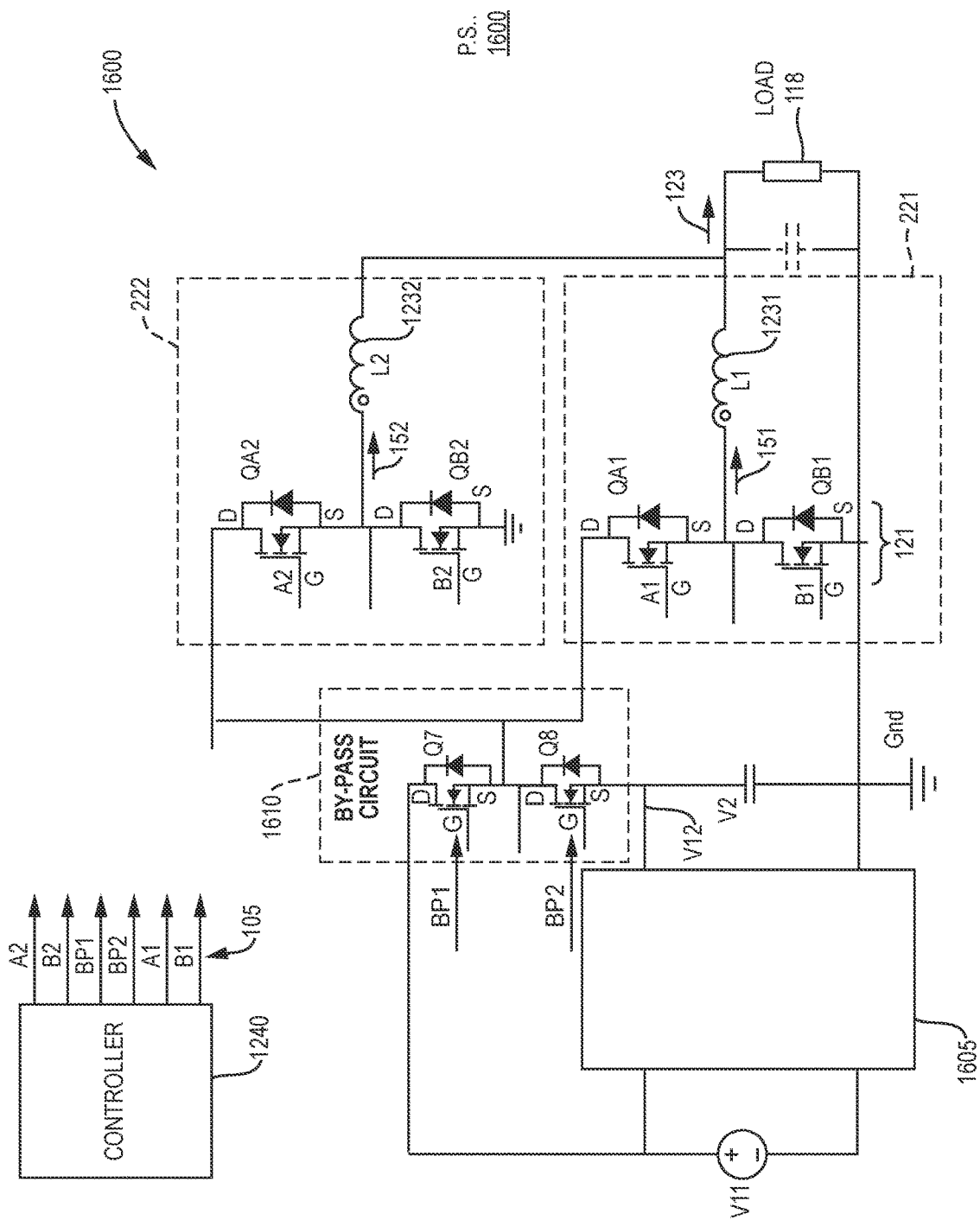
FIG. 16 is an example diagram illustrating a multi-stage power converter circuit and corresponding bypass circuit according to embodiments herein.

FIG. 16 is an example diagram illustrating a first stage power converter circuit and corresponding bypass circuit according to embodiments herein.

In this example embodiment, the voltage converter 1605 (such as a switched tank converter or other suitable power converter circuit) derives the input voltage V12 based on input voltage V11 such as via step down functionality. In one embodiment, the input voltage V11 is substantially greater in magnitude than the voltage V12.

For example, by way of non-limiting example embodiment, the voltage V11 can be 6 VDC, while the input voltage V12 is 1.5 VDC. In one embodiment, the controller 1240 controls the switches in phases 221 and 222 to produce an output voltage 123 of 0.75 VDC. Thus, in one embodiment, the intermediate bus voltage V12 (derived from a power input) is a fixed magnitude around twice the magnitude of the output voltage 123.

Additionally, in one embodiment, the multi-phase buck converter (phase 221, 222, etc.) operates at around 50% duty cycle, which provides symmetric behavior both for positive and negative load changes. The impedance of the load path is minimized. Inductors L1 and L2 are acting basically as a current source into the load 118. The output capacitors Cl at the point-of-load 118 can be reduced or entirely eliminated.

Alternatively, in accordance with further embodiments, the power converter circuit 1605 (voltage divider) provides a voltage to the buck converter close in magnitude to a magnitude of the output voltage 123. In such an instance, the buck converter (phases 221, 222) operate at a duty cycle of around 80%, which it can then ramp down currents very efficiently in a power boost mode. In this case a slope booster (as described herein) can help to ramp up positive currents in a fast and efficient manner.

In a yet further embodiment, the power converter circuit 1605 provides a voltage V2 to the buck converter close to a magnitude of the output voltage 123, in which the buck converter operates at a duty cycle between 0.5 and 1 in normal operation. In case of power boost mode, the power converter circuit 1605 is bypassed via a bypass circuit 1610. As further discussed below, the buck converter is able to operate directly from the intermediate bus voltage V11. In such an instance, no slope booster functionality is required.

More specifically, in one embodiment, the power supply 1600 (power supply 1200 plus a bypass circuit 1610) is operable to generate a respective output voltage 123 based on one of two voltages V11 or V12 depending on load conditions.

For example, during non-transient conditions such as when the load 118 consumes a relatively constant amount of current provided by the output voltage 123, the controller 1240 produces the control signal BP1 to deactivate switch Q7; the controller 1240 produces the control signal BP2 to activate switch Q8. In such an instance, the bypass circuit 1610 conveys voltage V12 to the switches QA1 and QA2, during which the phase 221 and 222 produce the output voltage based on the input voltage V12.

Conversely, during transient conditions such as when the load 118 suddenly consumes excess current provided by the output voltage 123, the controller 1240 produces the control signal BP1 to activate switch Q7; the controller 1240 produces the control signal BP2 to deactivate switch Q8. In such an instance, the bypass circuit 1610 conveys voltage V11 (higher voltage than voltage V12) to the switches QA1 and QA2, during which the phase 221 and 222 produce the output voltage based on the input voltage V11.

Application of the higher voltage provides a faster circuit response.

Figure 17:
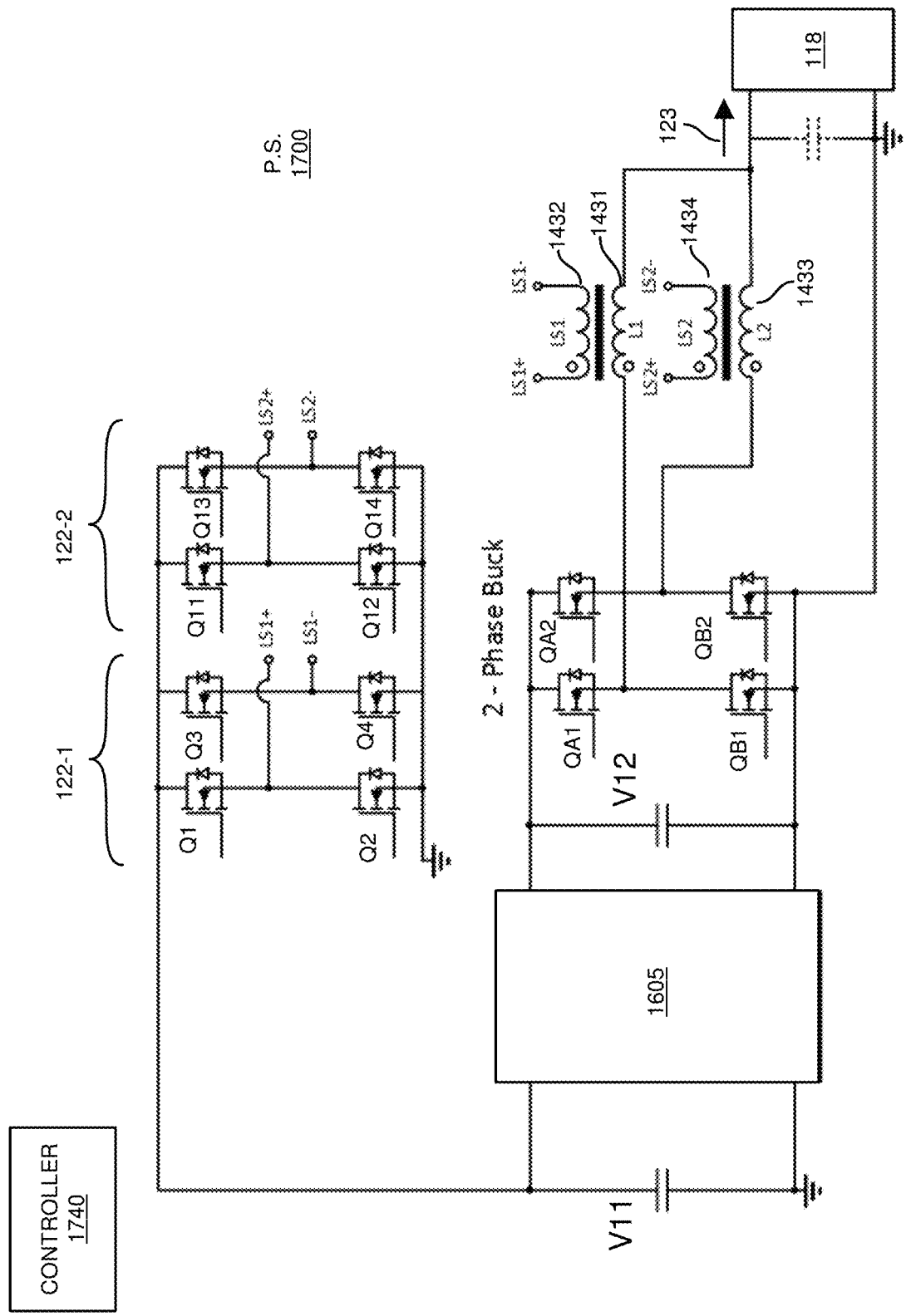
FIG. 17 is an example diagram illustrating of a power supply according to embodiments herein.

FIG. 17 is an example diagram illustrating a first stage power converter circuit and corresponding bypass circuit according to embodiments herein.

In this example embodiment, the power supply 1700 includes a multi-phase converter controlled by controller 1740. In a manner as previously discussed, control of switches QA1 and QB1 via controller 1740 controls generation of the output voltage 123 from the inductive path 1431. Similarly, control of switches QA2 and QB2 via controller 1740 controls generation of the output voltage 123 from the inductive path 1433.

Power supply 1700 further includes a first booster circuit 122-1 that controls a magnitude and direction of current through the inductive path 1432; second booster circuit 122-2 controls a magnitude and direction of current through the inductive path 1434. In a manner as previously discussed, each of the booster circuits 122-1 and 122-2 is operable to apply current adjustments to a respective inductive path to maintain the output voltage 123 within a desired range.

Figure 18:
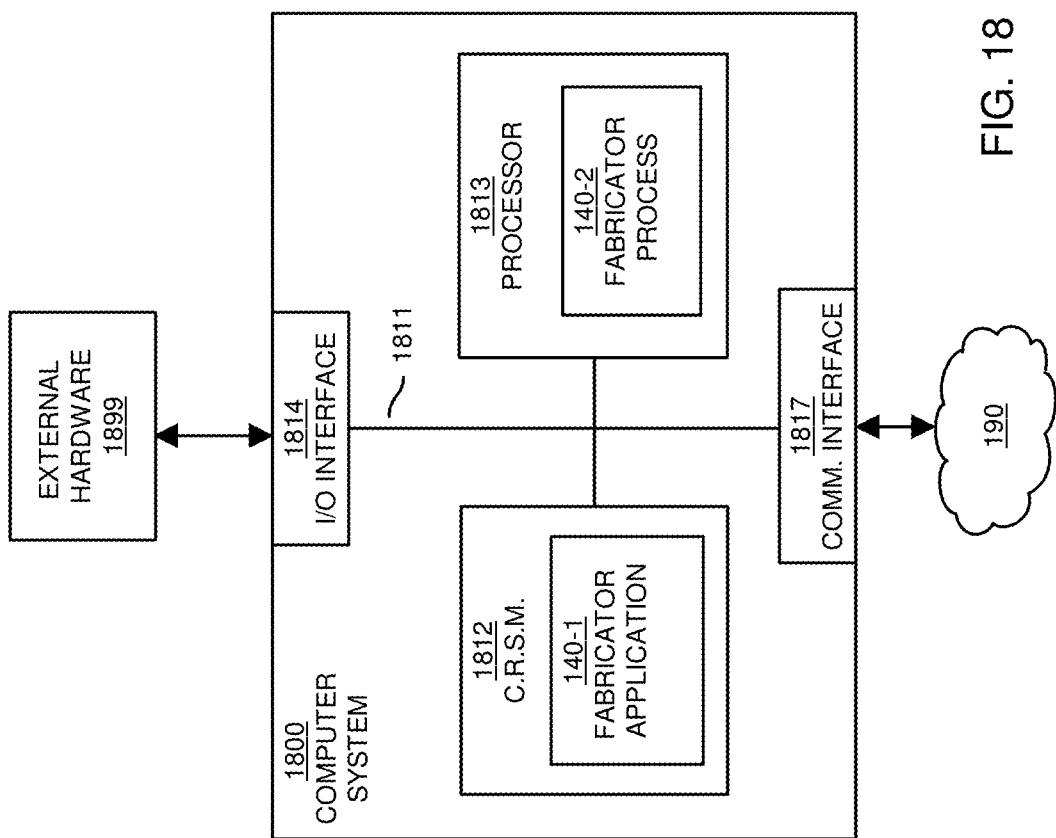
FIG. 18 is an example diagram illustrating example computer architecture (fabricator system, hardware, etc.) operable to execute one or more methods according to embodiments herein.

FIG. 18 is a diagram illustrating example computer architecture operable to execute one or more methods according to embodiments herein.

As previously discussed, any of the resources (such as controller 1240, fabricator 140, etc.) as discussed herein can be configured to include computer processor hardware and/or corresponding executable instructions to carry out the different operations as discussed herein.

As shown, computer system 1800 of the present example includes an interconnect 1811 that couples computer readable storage media 1812 such as a non-transitory type of media (which can be any suitable type of hardware storage medium in which digital information can be stored and retrieved), a processor 1813 (computer processor hardware), I/O interface 1814, and a communications interface 1817.

I/O interface(s) 1814 supports connectivity to external hardware 1899 such as a keyboard, display screen, repository, etc.

Computer readable storage medium 1812 can be any hardware storage device such as memory, optical storage, hard drive, floppy disk, etc. In one embodiment, the computer readable storage medium 1812 stores instructions and/or data.

As shown, computer readable storage media 1812 can be encoded with fabricator application 140-1 (e.g., including instructions) to carry out any of the operations as discussed herein.

During operation of one embodiment, processor 1813 accesses computer readable storage media 1812 via the use of interconnect 1811 in order to launch, run, execute, interpret or otherwise perform the instructions in fabricator application 140-1 stored on computer readable storage medium 1812. Execution of the fabricator application 140-1 produces fabricator process 140-2 to carry out any of the operations and/or processes as discussed herein.

Those skilled in the art will understand that the computer system 1800 can include other processes and/or software and hardware components, such as an operating system that controls allocation and use of hardware resources to execute fabricator application 140-1.

In accordance with different embodiments, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1850 may reside at any location or can be included in any suitable resource in any network environment to implement functionality as discussed herein.

Figure 19:
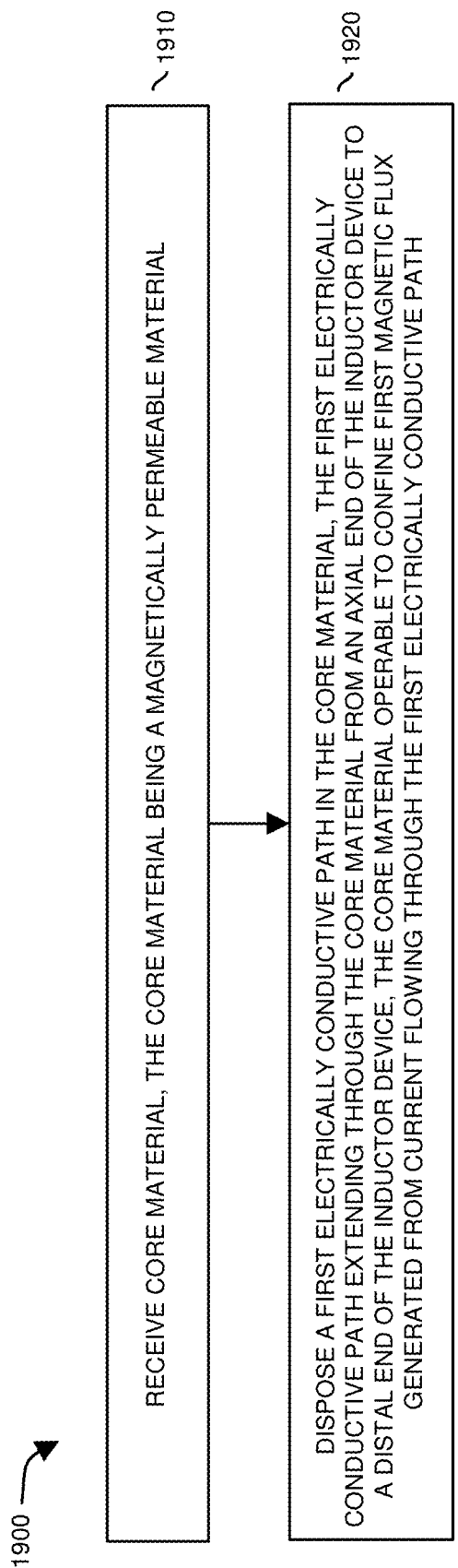
FIG. 19 is an example diagram illustrating a method according to embodiments herein.
Figure 20:
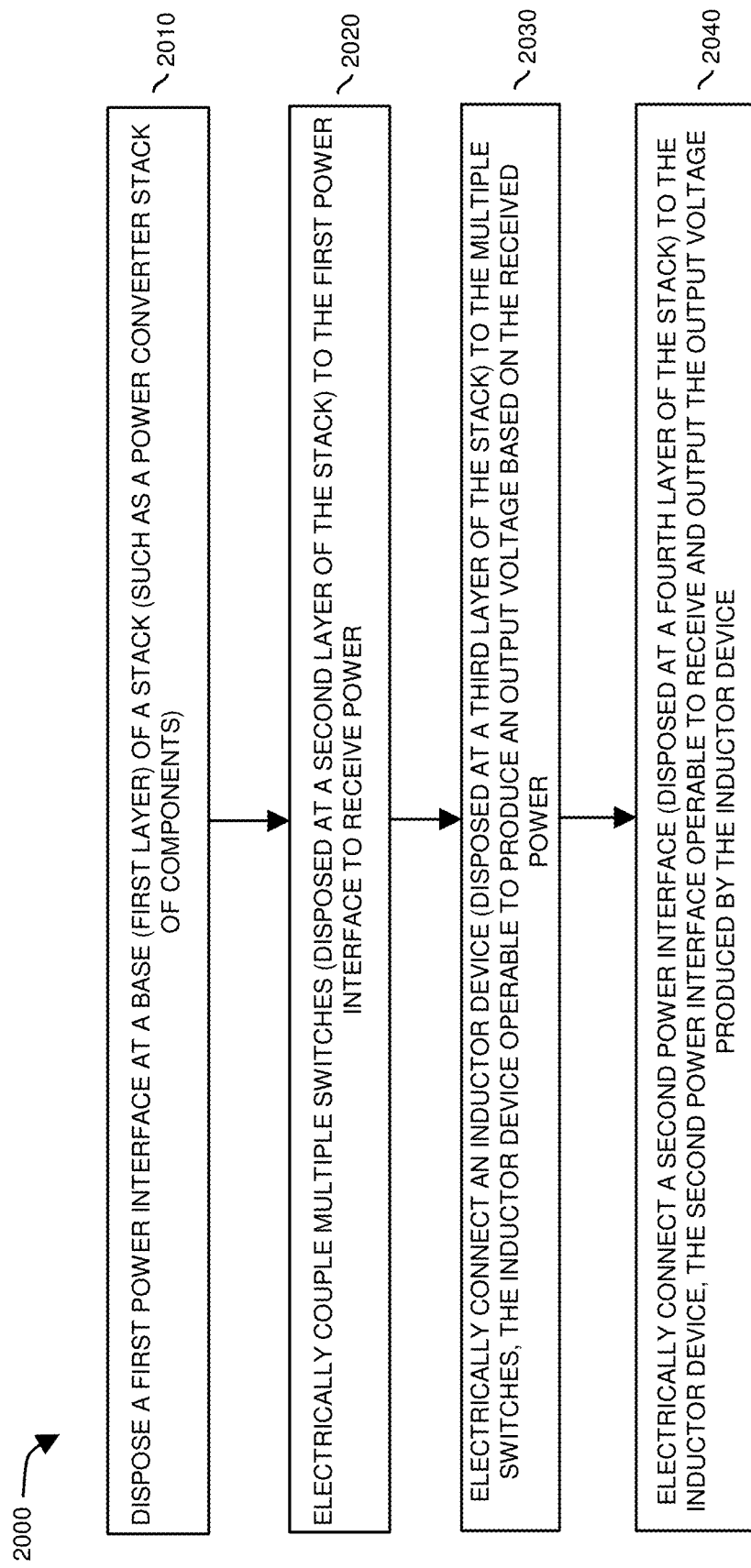
FIG. 20 is an example diagram illustrating a method according to embodiments herein.

Functionality supported by one or more resources as described herein are discussed via flowchart in FIGS. 19 and 20. Note that the steps in the flowcharts below can be executed in any suitable order.

FIG. 19 is a flowchart 1900 illustrating an example method according to embodiments herein. Note that there will be some overlap with respect to concepts as discussed above.

In processing operation 1910, the fabricator 140 receives core material 120. The core material 120 is a magnetically permeable material.

In processing operation 1920, in furtherance of fabricating the inductor device 110, the fabricator 140 disposes one or more electrically conductive paths in the core material 120. Each of the electrically conductive paths (such as 131, 132, etc.) extends (such as axially) through the core material 120 from a first axial end 141 (input end) of the inductor device 110 to a second axial end 142 (output end) of the inductor device 110. The core material 120 is operable to confine respective magnetic flux generated from current flowing through each of the electrically conductive paths.

FIG. 20 is a flowchart 2000 illustrating an example method according to embodiments herein. Note that there will be some overlap with respect to concepts as discussed above.

In processing operation 2010, the fabricator 140 disposes a first power interface at a base (first layer) of a stack (such as a power converter stack assembly of components).

In processing operation 2020, the fabricator 140 electrically couple multiple switches (disposed at a second layer of the stack) to the first power interface to receive power.

In processing operation 2030, the fabricator 140 electrically connect an inductor device (disposed at a third layer of the stack) to the multiple switches, the inductor device operable to produce an output voltage based on the received power.

In processing operation 2040, the fabricator 140 electrically connect a second power interface (disposed at a fourth layer of the stack) to the inductor device, the second power interface operable to receive and output the output voltage produced by the inductor device.

Note again that techniques herein are well suited for use in inductor and power converter applications. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
   a stack of components including:
   a first power interface disposed at a base of the stack;
   multiple switches coupled to the first power interface to receive power;
   an inductor device electrically connected to the multiple switches, the inductor device operable to produce an output current based on the received power;
   a second power interface operable to receive and output the output current; and
   wherein the inductor device includes a layer of magnetic permeable material disposed in the stack between the multiple switches and the second power interface.

2. The apparatus as in claim 1, wherein the first power interface includes first contact elements operable to connect the first power interface at the base of the stack to a host substrate; and
   wherein the second power interface of the stack includes second contact elements operable to couple a dynamic load to the second power interface of the stack.

3. The apparatus as in claim 1, wherein the first power interface includes contacts to couple the multiple switches to an input voltage node and a reference voltage node.

4. The apparatus as in claim 3, wherein the multiple switches are vertical field effect transistors disposed at a level of the stack between the first power interface and the inductor device.

5. The apparatus as in claim 1, wherein the multiple switches in the stack are operable to switch between coupling an input voltage and a ground reference voltage received through the first power interface to an inductive path of the inductor device, the inductive path extending from the multiple switches in the stack to the second power interface in the stack.

6. The apparatus as in claim 1, wherein the stack of components is a power converter operable to convert an input voltage received at the first power interface into the output current outputted from the second power interface; and
   wherein the inductor device includes multiple inductive paths disposed in the stack between the multiple switches and the second power interface.

7. The apparatus as in claim 6, wherein the multiple inductive paths include a first inductive path and a second inductive path extending through the magnetic permeable material of the inductor device, the first inductive path disposed in a first phase of the power converter, the second inductive path disposed in a second phase of the power converter, a combination of the first phase and the second phase disposed in parallel to produce the output current.

8. The apparatus as in claim 6, wherein the multiple inductive paths in the inductor device include a first inductive path and a second inductive path, the first inductive path disposed in a power converter phase of the power converter, the second inductive path magnetically coupled to the first inductive path, a combination of the power converter phase and the second inductive path operable to produce the output current.

9. The apparatus as in claim 1, wherein the inductor device includes an inductive path, the inductive path being a non-winding path extending from a first layer in the stack including the multiple switches to a second layer in the stack including the second power interface.

10. The apparatus as in claim 1, wherein the inductor device includes a first inductive path and a second inductive path, the first inductive path being a first non-winding path extending from a first layer in the stack including the multiple switches to a second layer in the stack including the second power interface, the second inductive path being a second non-winding path extending from the first layer in the stack including the multiple switches to the second layer in the stack including the second power interface.

11. The apparatus as in claim 1, wherein the inductor device comprises:
   a first electrically conductive path extending through the magnetic permeable material from a first end of the inductor device to a second end of the inductor device, presence of the magnetic permeable material rendering the first electrically conductive path to be a first inductive path.

12. The apparatus as in claim 11, wherein the inductor device comprises:
   a second electrically conductive path extending through the magnetic permeable material from the first end of the inductor device to the second end of the inductor device, presence of the core material rendering the second electrically conductive path to be a second inductive path.

13. The apparatus as in claim 12, wherein the first inductive path and the second inductive path are connected in parallel.

14. The apparatus as in claim 1 further comprising:
   a first electrically conductive path extending from a first layer of the stack including the first power interface and a second layer of the stack including the second power interface, the first electrically conductive path coupled to a reference voltage node.

15. The apparatus as in claim 14, wherein the first electrically conductive path provides perimeter shielding to the inductor device.

16. The apparatus as in claim 15 further comprising:
   a second electrically conductive path disposed in the first layer of the stack, the second electrically conductive path coupled to an input voltage node; and
   a first capacitor, the first capacitor coupled between the first electrically conductive path and the second electrically conductive path.

17. The apparatus as in claim 16 further comprising:
   a third electrically conductive path disposed in the second layer of the stack including the second power interface, the third electrically conductive path conveying the output current; and
   a second capacitor disposed in the third layer, the second capacitor coupled between the third electrically conductive path and the first electrically conductive path.

18. The apparatus as in claim 1, wherein the multiple switches include a first switch and a second switch;
   wherein a source node of the first switch is coupled to a reference voltage node of the first power interface, a drain node of the first switch being coupled to an inductive path of the inductor device; and
   wherein a drain node of the second switch is coupled to an input voltage node of the first power interface, a source node of the second switch being coupled to the inductive path of the inductor device.

19. A system comprising:
a circuit board;
the stack of components as in claim 1, the base of the stack coupled to the circuit board; and
a load, the load powered by the output current.

20. The apparatus as in claim 1, wherein the inductor device includes an electrically conductive path extending through the magnetic permeable material from a first axial end of the inductor device to a second axial end of the inductor device.

21. The apparatus as in claim 20, wherein the electrically conductive path is a non-winding path extending between the first axial end of the inductor device and the second axial end of the inductor device.

22. The apparatus as in claim 20, wherein the first power interface is disposed in a first layer of the stack, the first layer being a bottom layer of the stack;
wherein the multiple switches are disposed in a second layer of the stack above the first layer;
wherein the layer of magnetic permeable material is disposed in a third layer of the stack above the second layer; and
wherein the second power interface is disposed in a fourth layer of the stack above the third layer.

23. The apparatus as in claim 22 further comprising:
a load coupled to the third layer, the second power interface in the fourth layer operative to convey the output current from the inductor device to the load; and
wherein the first layer including the first power interface is coupled to a host substrate.

24. The apparatus as in claim 2, wherein the inductor device is disposed in the stack between the multiple switches and the second power interface.

25. The apparatus as in claim 1, wherein the inductor device includes an electrically conductive path extending through the magnetic permeable material, the electrically conductive path oriented vertically in the stack to support current flow in a direction from the base of the stack to a load coupled to the second power interface.

26. The apparatus as in claim 1, wherein the inductor device includes a first electrically conductive path extending through the magnetic permeable material from a first axial end of a first inductor device to a second axial end of the first inductor device; and
wherein the inductor device includes a second electrically conductive path extending through the magnetic permeable material from a first axial end of a second inductor device to a second axial end of the second inductor device.

27. The apparatus as in claim 26, wherein the first electrically conductive path is oriented in parallel with the second electrically conductive path; and
wherein the output current includes a combination of: i) first current supplied through the first electrically conductive path, and ii) second current supplied through the second electrically conductive path.

28. The apparatus as in claim 26, wherein the magnetic permeable material provides inductive coupling between the first electrically conductive path and the second electrically conductive path.

29. A method of fabricating a stack of components in a power converter, the method comprising:
disposing a first power interface at a base of the stack;
coupling multiple switches to the first power interface to receive power through the first power interface;
fabricating the stack to include an inductor device in which a first axial end of the inductor device is connected to the multiple switches, the inductor device including a layer of magnetic permeable material between the first axial end of the inductor device and a second axial end of the inductor device, the second axial end of the inductor device operable to output an output current based on the received power; and
connecting a second power interface to the second axial end of the inductor device, the second power interface operable to receive and output the output current outputted from the inductor device.

30. The method as in claim 29 further comprising:
fabricating the first power interface to include first contact elements operable to connect the first power interface at the base of the stack to a host substrate; and
fabricating the second power interface to include second contact elements operable to couple a dynamic load to the stack.

31. The method as in claim 29 further comprising:
fabricating the first power interface to couple the multiple switches to an input voltage node and a reference voltage node.

32. The method as in claim 31, wherein the multiple switches are vertical field effect transistors disposed between the first power interface and the inductor device.

33. The method as in claim 29 further comprising:
disposing the multiple switches in the stack to switch between coupling an input voltage and a reference voltage received through the first power interface to an inductive path of the inductor device, the inductive path extending from the multiple switches in the stack to the second power interface in the stack.

34. The method as in claim 29, wherein the stack of components is a power converter operable to convert an input voltage received at the first power interface into the output current outputted from the second power interface, the method further comprising:
fabricating the inductor device to include multiple inductive paths disposed in the stack between the multiple switches and the second power interface.

35. The method as in claim 34 further comprising:
fabricating the multiple inductive paths to include a first inductive path and a second inductive path extending through the inductor device, the first inductive path disposed in a first phase of the power converter, the second inductive path disposed in a second phase of the power converter, a combination of the first phase and the second phase disposed in parallel to produce the output current.

36. The method as in claim 35, wherein the multiple inductive paths include a first inductive path and a second inductive path, the first inductive path disposed in a phase of the power converter, the second inductive path magnetically coupled to the first inductive path to apply magnetic energy adjustments to the first inductive path, a combination of the phase and the second inductive path operable to produce the output current.

37. The method as in claim 29 further comprising:
fabricating the inductor device to include an inductive path, the inductive path being a non-winding path extending from a first layer in the stack including the multiple switches to a second layer in the stack including the second power interface.

38. The method as in claim 29 further comprising:
fabricating the inductor device to include a first inductive path and a second inductive path, the first inductive path fabricated as a first non-winding path extending from a first layer in the stack including the multiple switches to a second layer in the stack including the second power interface, the second inductive path fabricated as a second non-winding path extending from the first layer in the stack including the multiple switches to the second layer in the stack including the second power interface.

39. The method as in claim 29 further comprising:

fabricating the inductor device to include: i) core material, the core material being magnetically permeable ferromagnetic material, and ii) a first electrically conductive path extending through the core material from a first end of the inductor device to a second end of the inductor device, presence of the core material rendering the first electrically conductive path to be a first inductive path.

40. The method as in claim 39 further comprising:

fabricating the inductor device to include a second electrically conductive path extending through the core material from the first end of the inductor device to the second end of the inductor device, presence of the core material rendering the second electrically conductive path to be a second inductive path.

41. The method as in claim 40 further comprising:

connecting the first inductive path and the second inductive path in parallel.

42. The method as in claim 29 further comprising:

fabricating the stack to include a first electrically conductive path extending from a first layer of the stack including the first power interface and a second layer of the stack including the second power interface, the first electrically conductive path coupled to a reference voltage node.

43. The method as in claim 42, wherein the first electrically conductive path provides perimeter shielding to the inductor device.

44. The method as in claim 43 further comprising:

disposing a second electrically conductive path in the first layer of the stack, the second electrically conductive path coupled to an input voltage node; and fabricating the stack to include a first capacitor, the first capacitor coupled between the first electrically conductive path and the second electrically conductive path.

45. The method as in claim 44 further comprising:

disposing a third electrically conductive path in the second layer of the stack including the second power interface, the third electrically conductive path conveying the output current; and fabricating the stack to include a second capacitor in the second layer, the second capacitor coupled between the first electrically conductive path and the third electrically conductive path.

46. The method as in claim 29 further comprising:

fabricating the multiple switches to include a first switch and a second switch;

coupling a source node of the first switch to a reference voltage node of the first power interface;

coupling a drain node of the first switch to an inductive path of the inductor device;

coupling a drain node of the second switch an input voltage node of the first power interface; and coupling a source node of the second switch to the inductive path of the inductor device.

47. The method as in claim 46 further comprising:

coupling a controller to the stack, the controller operable to control switching of the first switch and the second switch to convert an input voltage received at the input voltage node into the output current.

48. A method comprising:

receiving a circuit board; and coupling the base of the stack of components of claim 1 to the circuit board, the stack of components operative to generate the output current to power a load coupled to the circuit board.

* * * * *